United States Patent
Ni et al.

(10) Patent No.: US 8,043,099 B1
(45) Date of Patent: Oct. 25, 2011

(54) EXTENDED USB PLUG, USB PCBA, AND USB FLASH DRIVE WITH DUAL-PERSONALITY

(75) Inventors: Jim Chin-Nan Ni, San Jose, CA (US);
David Nguyen, San Jose, CA (US);
David Q. Chow, San Jose, CA (US);
Frank I-Kang Yu, Palo Alto, CA (US);
Abraham C. Ma, Fremont, CA (US);
Ming-Shiang Shen, Taipei (TW)

(73) Assignee: Super Talent Electronics, Inc., San Jose, CA (US)

( * ) Notice: Subject to any disclaimer, the term of this patent is extended or adjusted under 35 U.S.C. 154(b) by 589 days.

(21) Appl. No.: 11/866,927

(22) Filed: Oct. 3, 2007

Related U.S. Application Data

(63) Continuation-in-part of application No. 11/864,696, filed on Sep. 28, 2007, which is a continuation-in-part of application No. 11/624,667, filed on Jan. 18, 2007, now abandoned, application No. 11/866,927, and a continuation-in-part of application No. 10/854,004, filed on May 25, 2004, now Pat. No. 7,836,236, which is a continuation-in-part of application No. 10/708,172, filed on Feb. 12, 2004, now Pat. No. 7,021,971, application No. 11/866,927, and a continuation-in-part of application No. 11/864,671, filed on Sep. 28, 2007, now abandoned, which is a continuation-in-part of application No. 11/466,759, filed on Aug. 23, 2006, now Pat. No. 7,702,831, application No. 11/866,927, and a continuation-in-part of application No. 11/845,747, filed on Aug. 27, 2007.

(51) Int. Cl.
*H01R 13/44* (2006.01)
(52) U.S. Cl. ..................................... 439/131

(58) Field of Classification Search .................. 439/76.1, 439/646, 131; 361/726, 737, 752; 235/492
See application file for complete search history.

(56) References Cited

U.S. PATENT DOCUMENTS

| | | | |
|---|---|---|---|
| 4,572,604 A * | 2/1986 | Ammon et al. | 439/633 |
| 5,623,552 A | 4/1997 | Lane | |
| 5,907,856 A | 5/1999 | Estakhri et al. | |
| 5,959,541 A | 9/1999 | DiMaria et al. | |
| 6,000,006 A | 12/1999 | Bruce et al. | |
| 6,012,636 A | 1/2000 | Smith | |
| 6,069,920 A | 5/2000 | Schulz et al. | |
| 6,081,858 A | 6/2000 | Abudayyeh et al. | |
| 6,125,192 A | 9/2000 | Bjorn et al. | |
| 6,193,152 B1 | 2/2001 | Fernando et al. | |
| 6,202,138 B1 | 3/2001 | Estakhri et al. | |
| 6,230,233 B1 | 5/2001 | Lofgren et al. | |
| 6,275,894 B1 | 8/2001 | Kuo et al. | |
| 6,321,478 B1 | 11/2001 | Klebes | |
| 6,547,130 B1 | 4/2003 | Shen | |

(Continued)

*Primary Examiner* — Neil Abrams
(74) *Attorney, Agent, or Firm* — Blakely Sokoloff Taylor & Zafman LLP

(57) ABSTRACT

An extended universal serial bus (USB) storage device is described herein. According to one embodiment, an extended USB storage device includes a printed circuit board assembly (PCBA) having a flash memory device and a flash controller mounted thereon, and an extended USB connector plug coupled to the PCBA for providing a USB compatible interface between an external device and the flash memory device and the flash controller, wherein the extended USB connector plug includes a first end used to couple to the external device and a second end coupled to the flash memory device and the flash controller. The extended USB connector plug includes multiple communication interfaces. Other methods and apparatuses are also described.

16 Claims, 36 Drawing Sheets

U.S. PATENT DOCUMENTS

| | | |
|---|---|---|
| 6,636,929 B1 | 10/2003 | Frantz et al. |
| 6,671,808 B1 * | 12/2003 | Abbott et al. .................... 726/4 |
| 6,718,407 B2 | 4/2004 | Martwick |
| 6,733,329 B2 * | 5/2004 | Yang ............................ 439/518 |
| 6,778,401 B1 * | 8/2004 | Yu et al. ....................... 361/752 |
| 6,792,487 B2 * | 9/2004 | Kao ................................ 710/74 |
| 6,854,984 B1 * | 2/2005 | Lee et al. ........................ 439/79 |
| 6,880,024 B2 | 4/2005 | Chen et al. |
| 6,894,864 B2 * | 5/2005 | Chang et al. ............... 360/97.01 |
| 7,004,780 B1 * | 2/2006 | Wang ............................ 439/353 |
| 7,021,971 B2 | 4/2006 | Chou et al. ................... 439/660 |
| 7,066,742 B2 * | 6/2006 | Liang et al. ................. 439/76.1 |
| 7,103,765 B2 | 9/2006 | Chen |
| 7,165,998 B2 * | 1/2007 | Lee et al. ...................... 439/660 |
| 7,249,978 B1 | 7/2007 | Ni |
| 7,257,714 B1 | 8/2007 | Shen |
| 7,295,431 B2 * | 11/2007 | Chuang .................... 361/679.55 |
| 7,416,419 B2 * | 8/2008 | Collantes et al. ............ 439/76.1 |
| 7,428,605 B2 * | 9/2008 | Ni et al. ......................... 710/62 |
| 2001/0043174 A1 | 11/2001 | Jacobsen et al. |
| 2002/0166023 A1 | 11/2002 | Nolan et al. |
| 2003/0046510 A1 | 3/2003 | North |
| 2003/0163656 A1 | 8/2003 | Ganton |
| 2004/0148482 A1 | 7/2004 | Grundy et al. |
| 2004/0255054 A1 | 12/2004 | Pua et al. |
| 2005/0079738 A1 * | 4/2005 | Ahn ................................ 439/1 |
| 2005/0102444 A1 | 5/2005 | Cruz |
| 2005/0120146 A1 | 6/2005 | Chen et al. |
| 2005/0160213 A1 | 7/2005 | Chen |
| 2005/0164532 A1 * | 7/2005 | Ni et al. .......................... 439/79 |
| 2005/0181645 A1 * | 8/2005 | Ni et al. .......................... 439/79 |
| 2005/0193161 A1 | 9/2005 | Lee et al. |
| 2005/0246243 A1 | 11/2005 | Adams et al. |
| 2005/0268082 A1 | 12/2005 | Poisner |
| 2006/0026348 A1 * | 2/2006 | Wallace et al. ............... 711/115 |
| 2006/0065743 A1 | 3/2006 | Fruhauf |
| 2006/0075174 A1 | 4/2006 | Vuong |
| 2006/0106962 A1 | 5/2006 | Woodbridge et al. |
| 2006/0161725 A1 | 7/2006 | Lee et al. |
| 2006/0206702 A1 | 9/2006 | Fausak |
| 2006/0242395 A1 | 10/2006 | Fausak |
| 2007/0094489 A1 | 4/2007 | Ota et al. |
| 2007/0113067 A1 | 5/2007 | Oh et al. |
| 2007/0113267 A1 | 5/2007 | Iwanski et al. |
| 2007/0130436 A1 | 6/2007 | Shen |
| 2007/0292009 A1 * | 12/2007 | Nguyen et al. ................ 382/124 |
| 2010/0069117 A1 * | 3/2010 | Knighton ...................... 455/557 |

* cited by examiner

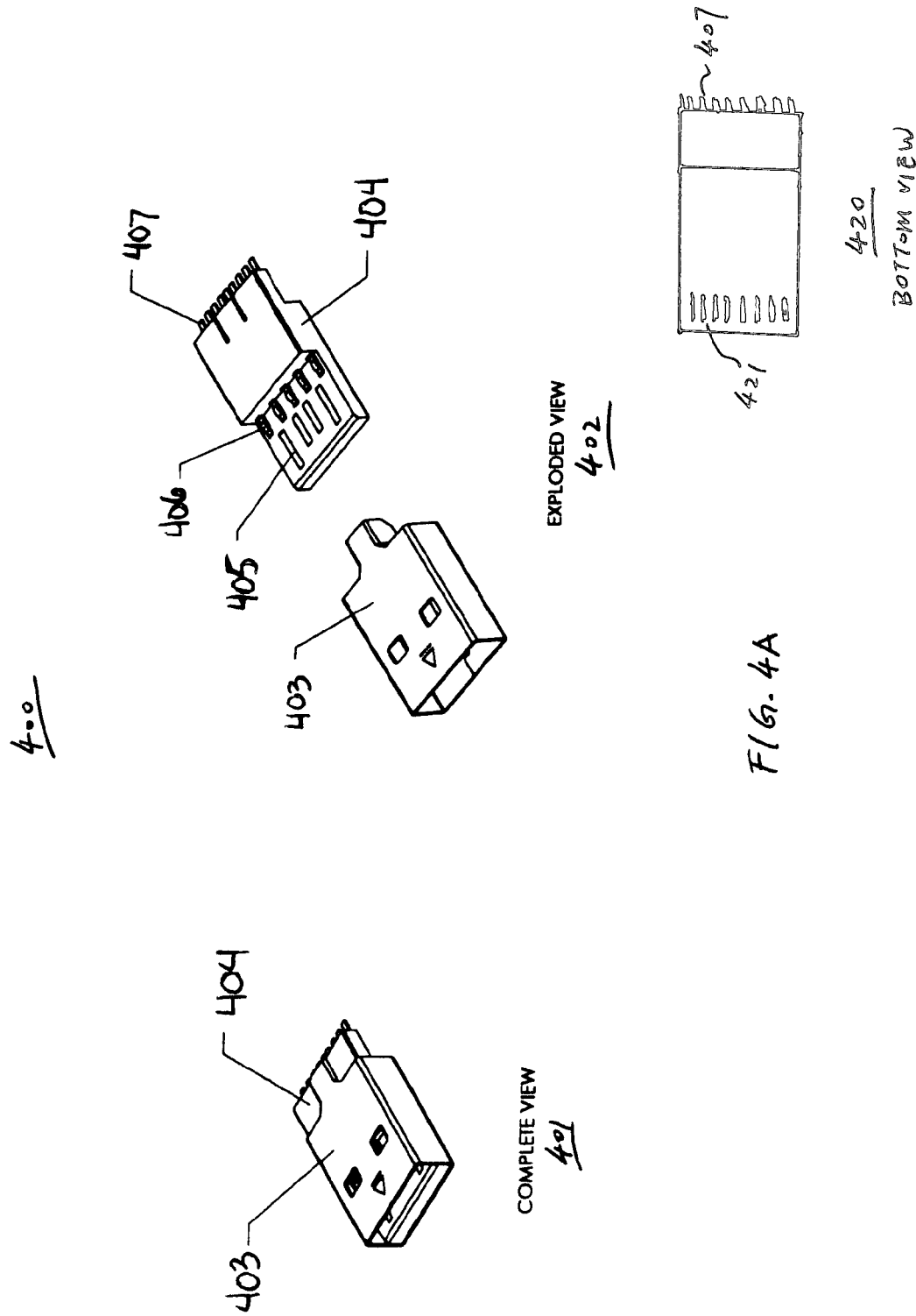

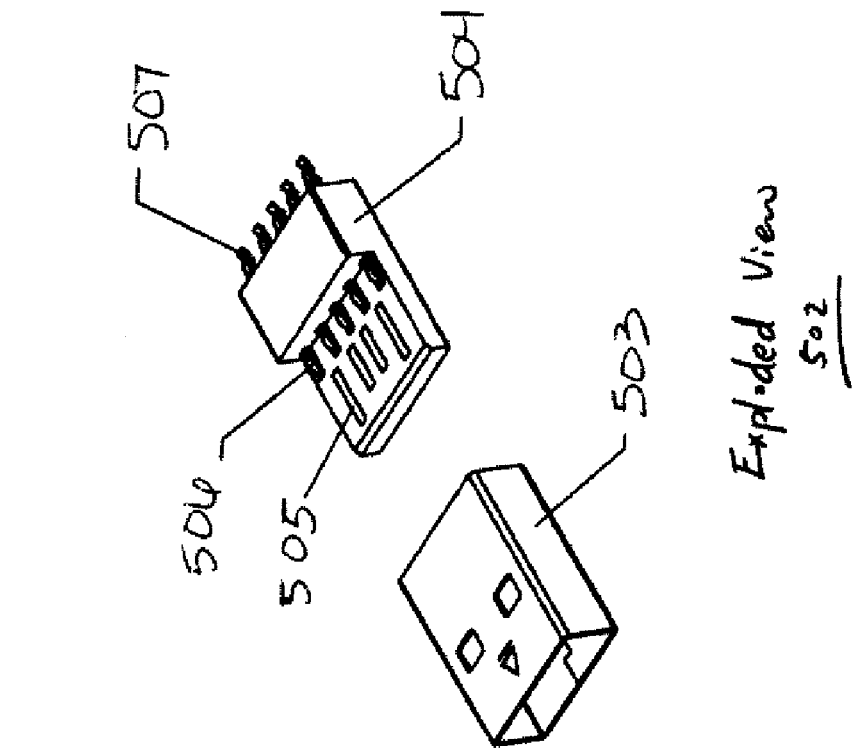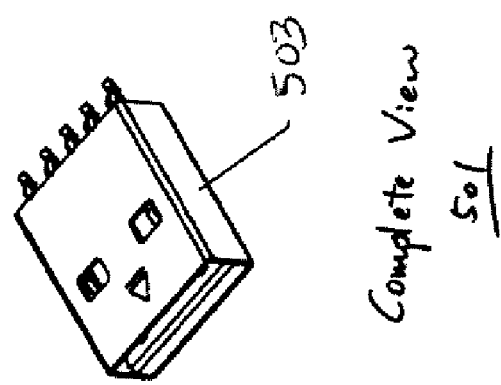
FIG. 5A

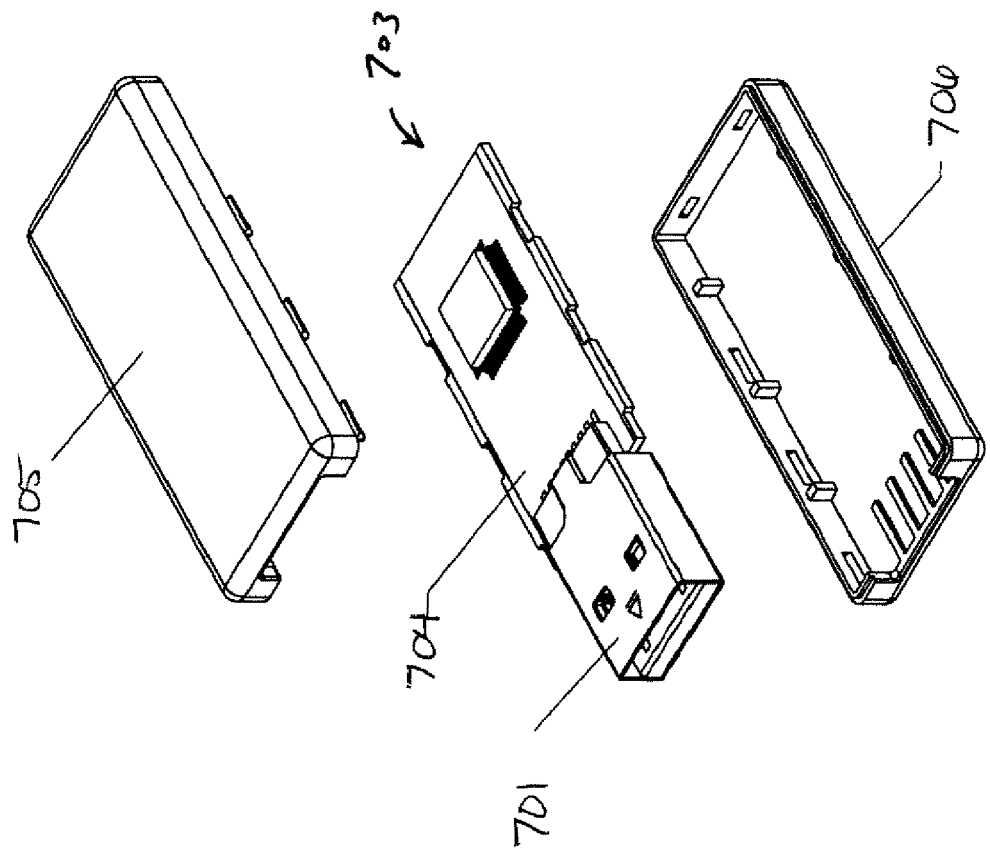
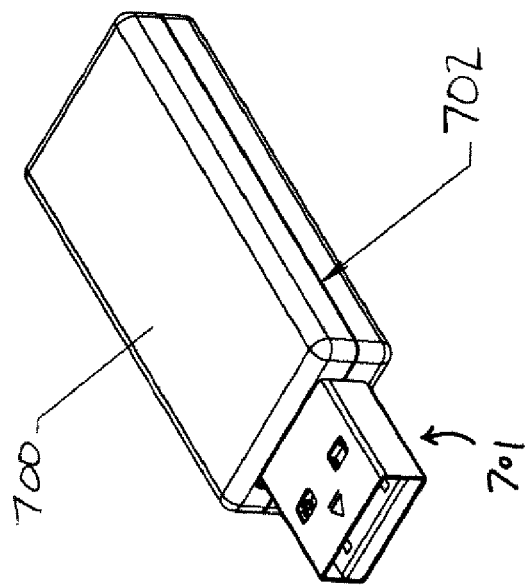
FIG. 7

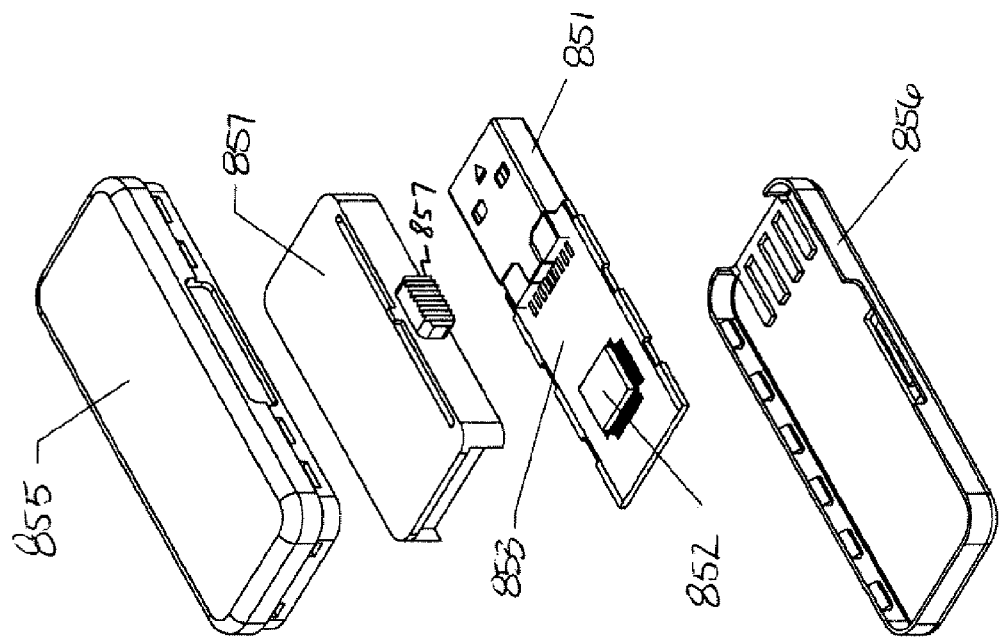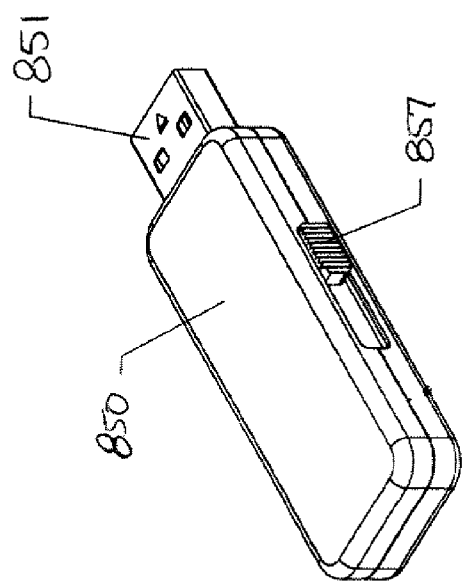
FIG. 8B

Table of Extended and Standard Pins in the Extended USB Connector and Socket

| SIDE | PIN-OUT | USB | MODIFIED PCIE 0 | SATA | MODIFIED PCIE 1 | MODIFIED PCIE 2 | MODIFIED PCIE 3 |
|---|---|---|---|---|---|---|---|
| A | 1 | 5V | 5V | 5V | 5V | 5V | 5V |
| A | 2 | D- | D- | D- | D- | D- | D- |
| A | 3 | D+ | D+ | D+ | D+ | D+ | D+ |
| A | 4 | GND | GND | GND | GND | GND | GND |
| B | 1 | | 3.3V | 3.3V | PETn | PETn | PETn |
| B | 2 | | 1.5V | N/C | PETp | PETp | PETp |
| B | 3 | | PETn | T- | GND | GND | GND |
| B | 4 | | PETp | T+ | PERn | PERn | PERn |
| B | 5 | | GND | GND | PERp | PERp | PERp |
| B | 6 | | PERn | R- | | PETn 1 | PETn 1 |
| B | 7 | | PERp | R+ | | PETp 1 | PETp 1 |
| B | 8 | | N/C | 12V | | GND | GND |
| B | 9 | | | | | PERn 1 | PERn 1 |
| B | 10 | | | | | PERp 1 | PERp 1 |
| B | 11 | | | | | | PETn 2 |
| B | 12 | | | | | | PETp 2 |
| B | 13 | | | | | | GND |
| B | 14 | | | | | | PERn 2 |
| B | 15 | | | | | | PERp 2 |
| B | 16 | | | | | | PETn 3 |
| B | 17 | | | | | | PETp 3 |
| B | 18 | | | | | | GND |
| B | 19 | | | | | | PERn 3 |
| B | 20 | | | | | | PERp 3 |

FIG. 13

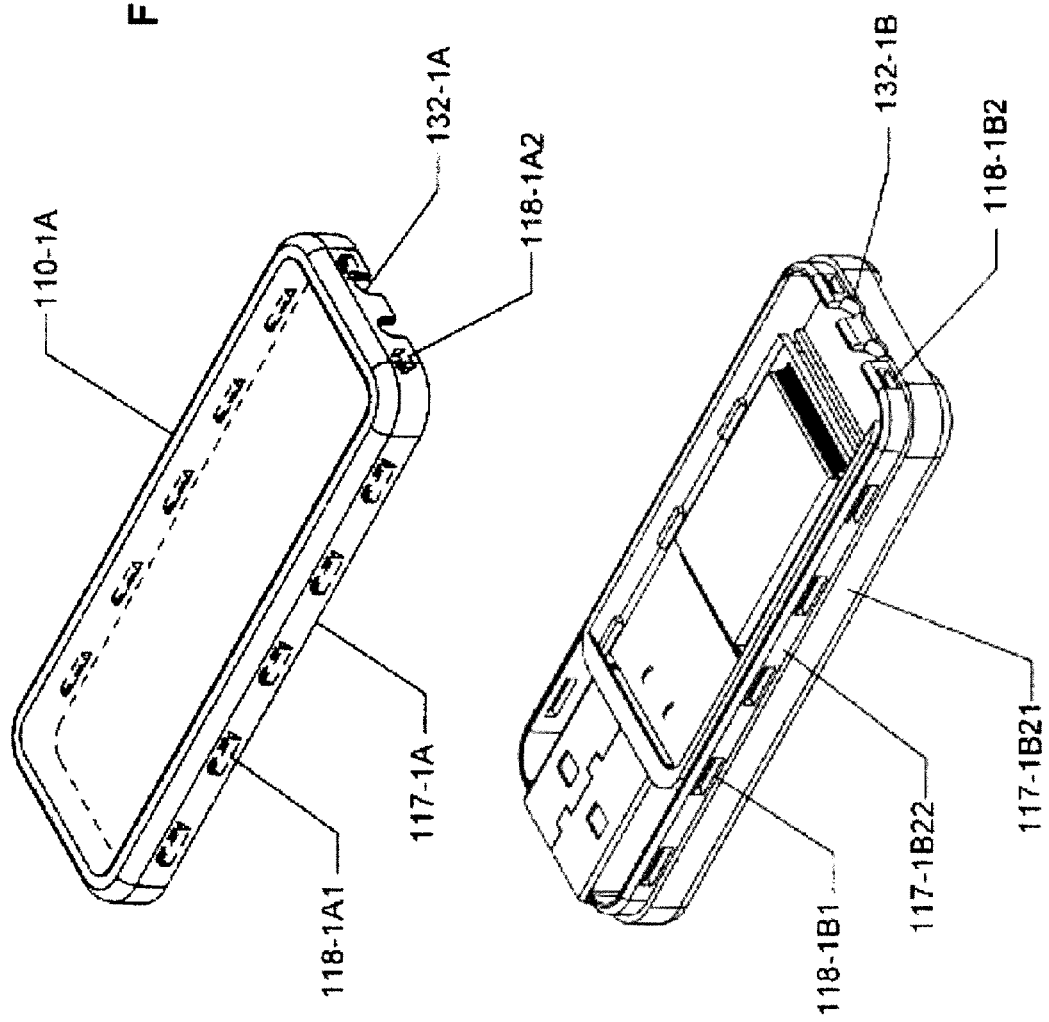

EXTENDED USB PLUG, USB PCBA, AND USB FLASH DRIVE WITH DUAL-PERSONALITY

RELATED APPLICATIONS

This application is a continuation-in-part (CIP) of co-pending U.S. application Ser. No. 11/864,696, entitled "Backward Compatible Extended USB Plug And Receptacle With Dual Personality", filed Sep. 28, 2007, which is a CIP of U.S. Patent application for "Electronic Data Storage Medium with Fingerprint Verification Capability," U.S. application Ser. No. 11/624,667, filed Jan. 18, 2007, and a continuation-in-part of U.S. Patent application for "Extended Secure-Digital Card Devices and Hosts," U.S. application Ser. No. 10/854,004, filed May 25, 2004, which is a continuation-in-part of U.S. patent application Ser. No. 10/708,172, now U.S. Pat. No. 7,021,971.

This application is also a CIP of co-pending U.S. patent application Ser. No. 11/864,671, filed Sep. 28, 2007, which is a CIP of U.S. patent application Ser. No. 11/466,759, filed Aug. 3, 2006, entitled "Flash Memory Controller for Electronic Data Flash Card. This application is also a CIP of co-pending U.S. patent application Ser. No. 11/845,747, filed Aug. 27, 2007. This application is also related to U.S. Pat. Nos. 7,108,560, 7,104,848, and 7,125,287.

The disclosure of the above-identified applications and patents is incorporated by reference herein in its entirety.

FIELD OF THE INVENTION

The present invention relates generally to extended universal serial bus (USB) connectors. More particularly, this invention relates to USB connectors having multiple interfaces.

BACKGROUND

Universal-Serial-Bus (USB) has been widely deployed as a standard bus for connecting peripherals such as digital cameras and music players to personal computers (PCs) and other devices. Currently, the top transfer rate of USB is 480 Mb/s, which is quite sufficient for most applications. Faster serial-bus interfaces are being introduced to address different requirements. PCI Express, at 2.5 Gb/s, and SATA, at 1.5 Gb/s and 3.0 Gb/s, are two examples of high-speed serial bus interfaces for the next generation devices, as are IEEE 1394 and Serial Attached Small-Computer System Interface (SCSI).

FIG. 1A shows a prior-art peripheral-side USB connector. USB connector 10 may be mounted on a board in the peripheral. USB connector 10 can be mounted in an opening in a plastic case (not shown) for the peripheral. USB connector 10 contains a small connector substrate 14, which is often white ceramic, black rigid plastic, or another sturdy substrate. Connector substrate 14 has four or more metal contacts 16 formed thereon. Metal contacts 16 carry the USB signals generated or received by a controller chip in the peripheral. USB signals include power, ground, and serial differential data D+, D−. USB connector 10 contains a metal case that wraps around connector substrate 14. The metal case touches connector substrate 14 on three of the sides of connector substrate 14. The top side of connector substrate 14, holding metal contacts 16, has a large gap to the top of the metal case. On the top and bottom of this metal wrap are formed holes 12. USB connector 10 is a male connector, such as a type-A USB connector.

FIG. 1B shows a female USB connector. Female USB connector 20 can be an integral part of a host or PC, or can be connected by a cable. Another connector substrate 22 contains four metal contacts 24 that make electrical contact with the four metal contacts 16 of the male USB connector 10 of FIG. 1A. Connector substrate 22 is wrapped by a metal case, but small gaps are between the metal case and connector substrate 22 on the lower three sides. Locking is provided by metal springs 18 in the top and bottom of the metal case. When male USB connector 10 of FIG. 1A is flipped over and inserted into Female USB connector 20 of FIG. 1B, metal springs 18 lock into holes 12 of male USB connector 10. This allows the metal casings to be connected together and grounded. Universal-Serial-Bus (USB) is a widely used serial-interface standard for connecting external devices to a host such as a personal computer (PC). Another new standard is PCI Express, which is an extension of Peripheral Component Interconnect (PCI) bus widely used inside a PC for connecting plug-in expansion cards. An intent of PCI Express is to preserve and re-use PCI software. Unfortunately, USB connectors with their 4 metal contacts do not support the more complex PCI Express standard.

FIGS. 2A-2B show an ExpressCard and its connector. A new removable-card form-factor known as ExpressCard has been developed by the Personal-Computer Memory Card International Association (PCMCIA), PCI, and USB standards groups. ExpressCard 26 is about 75 mm long, 34 mm wide, and 5 mm thick and has ExpressCard connector 28.

FIG. 2B shows that ExpressCard connector 28 fits into connector or socket 30 on a host when ExpressCard 26 is inserted into an ExpressCard slot on the host. Since ExpressCard connector 28 and socket 30 are 26-pin connectors, they contain many more signals than a 4-pin USB connector. The additional PCI-Express interface can be supported as well as USB. ExpressCard 26 can also use USB to communicate with the host. Differential USB data signals USBD+ and USBD− are connected between ExpressCard 26 and a host chip set. The host chip set contains a USB host controller to facilitate communication with ExpressCard 26.

PCI Express supports data rates up to 2.5 G/b, much higher than USB. While the ExpressCard standard is useful for its higher possible data rate, the 26-pin connectors and wider card-like form factor limit the use of ExpressCards. The smaller USB connector and socket are more desirable than the larger ExpressCard. Another interface, serial AT-attachment (SATA) supports data rates of 1.5 Gb/s and 3.0 Gb/s. However, SATA uses two connectors, one 7-pin connector for signals and another 15-pin connector for power. Due to its clumsiness, SATA is more useful for internal storage expansion than for external peripherals. While SATA and ExpressCard are much higher-speed interfaces than USB, they use larger, bulky connectors while USB has a single, small connector.

FIGS. 3A-3D shows cross-sections of a prior-art USB connector and socket. In FIG. 3A, a prior-art peripheral-side plug or USB connector has plastic housing 36 that the user can grip when inserting the USB connector into a USB socket such as the socket in FIG. 3B. Pin substrate 34 can be made of ceramic, plastic, or other insulating material, and supports metal contact pins 32. There are 4 metal contact pins 32 arranged as shown in the top view of pin substrate 34 in FIG. 3D. Metal cover 33 is an open-ended rectangular tube that wraps around pin substrate 34 and the gap above metal contact pins 32. In FIG. 3B, a prior-art host-side USB socket is shown, such as a USB socket on a host PC. Metal cover 38 is rectangular tube that surrounds pin substrate 42 and has an opening to receive the USB connector's pin substrate 34. Metal contact pins 44 are mounted on the underside of pin substrate 42. Mounting pin 40 is formed from metal cover 38 and is useful for mounting the USB socket to a printed-circuit board (PCB) or chassis on the host PC.

Metal contact pins 44 are arranged as shown in the bottom view of pin substrate 42 of FIG. 3C. The four metal contact pins 44 are arranged to slide along and make contact with the four metal contact pins 32 when the USB connector is inserted into the USB socket. Pin substrates 34, 42 are formed in an L-shape with matching cutouts above metal contact pins 32 and below metal contact pins 44 that fit together when inserted. Metal contact pins 32, 44 can have a slight bend or kink in them (not shown) to improve mechanical and electrical contact. The bend produces a spring-like action that is compressed when the USB connector is inserted into the USB socket. The force of the compressed spring improves contact between metal contact pins 32, 44. While useful, prior-art USB sockets and connectors have only four metal contact pins 32 that mate with four metal contact pins 44. The four metal contact pins carry power, ground, and differential data lines D+, D−. There are no additional pins for extended signals required by other standard buses, such as PCI Express or Serial ATA.

SUMMARY OF THE DESCRIPTION

An extended universal serial bus (USB) storage device is described herein. According to one embodiment, a USB storage device includes a printed circuit board assembly (PCBA) having a flash memory device and a flash controller mounted thereon, and an extended USB connector plug coupled to the PCBA for providing a USB compatible interface between an external device and the flash memory device and the flash controller, wherein the extended USB connector plug includes a first end used to couple to the external device and a second end coupled to the flash memory device and the flash controller. The first end of the extended USB connector plug includes an extended pin substrate that has an extended length that is longer than or equal to a standard length of the pin substrate of the standard USB connector plug, a plurality of plug standard metal contact pins disposed on the pin substrate, wherein when the standard pin substrate of the extended USB connector plug is inserted into a cavity of the standard USB socket, the standard metal contact pins make physical and electrical contact with plug standard metal contact pins on a plug pin substrate, and a plurality of plug extended metal contact pins on the extended pin substrate, wherein when the extended pin substrate of the extended USB connector plug is inserted into a cavity of the extended USB socket, the plug extended metal contact pins on the extended pin substrate make physical and electrical contact with socket extended metal contact pins on the extended USB socket. The second end of the extended USB connector plug includes a plurality of electrical contact pins to electrically coupling the flash memory device and the flash controller. Other methods and apparatuses are also described.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIGS. 4A-4C are block diagrams illustrating an extended USB device configuration according to one embodiment of the invention.

FIGS. 5A-5C are block diagrams illustrating an extended USB device configuration according to one embodiment of the invention.

FIG. 7 is a block diagram illustrating an extended USB device according to one embodiment of the invention.

FIG. 13 is a table of extended and standard pins in the extended USB connector and socket according to one embodiment of the invention.

FIGS. 18(A), 18(B) and 18(C) are exploded perspective views depicting assembly of the peripheral device of FIG. 14.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

According to certain embodiments of the invention, a USB storage device such as a USB flash device includes a dual personality extended USB plug which includes a metal case, and a connector substrate in multiple different form factors that can be coupled to a PCBA (printed circuit board assembly) having a flash memory such as multi-level cell (MLC) flash memory and a flash controller IC (integrated circuit) or a MLC chip-on-board (COB) design.

Figure 1A:
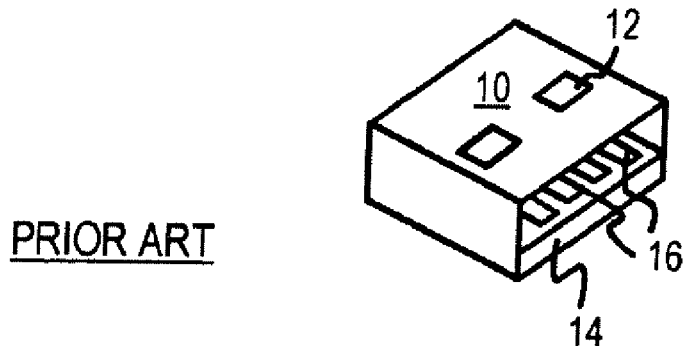
FIGS. 1A-1B show a conventional USB connector.
Figure 1B:
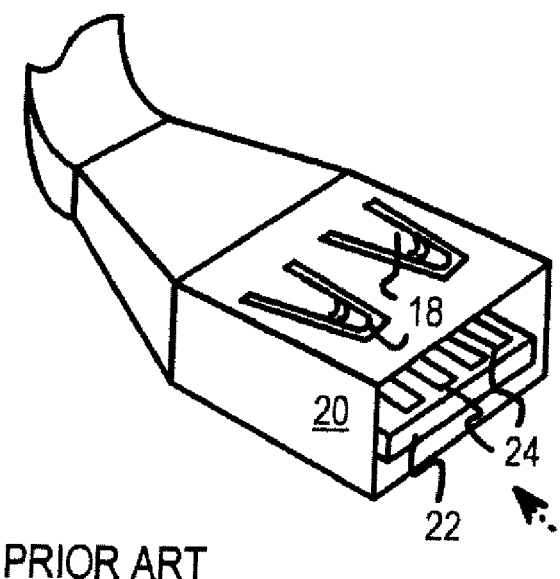
Figure 2A:
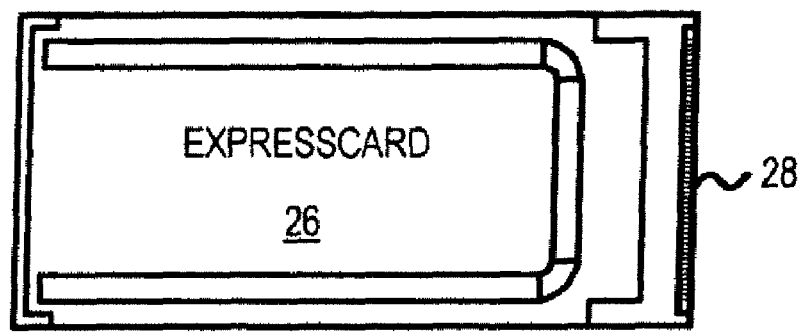
FIGS. 2A-2B show an ExpressCard and its connector.
Figure 2B:
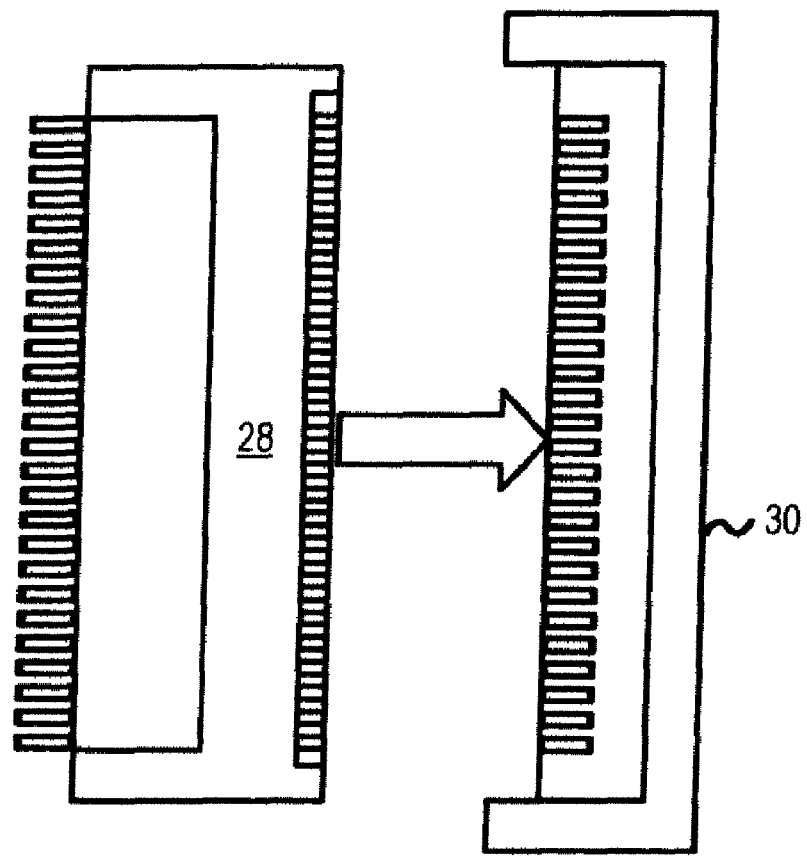
Figure 3A:
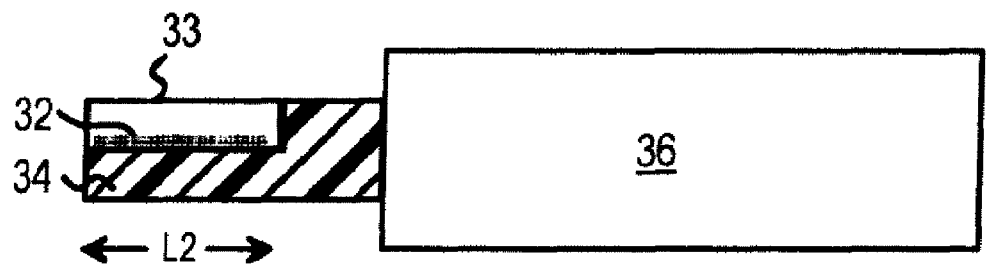
FIGS. 3A-3D show cross-sections of a prior-art USB connector and socket.
Figure 3B:
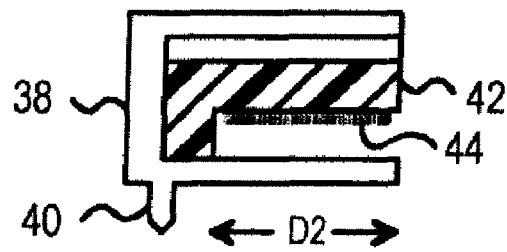
Figures 3C, 3D:
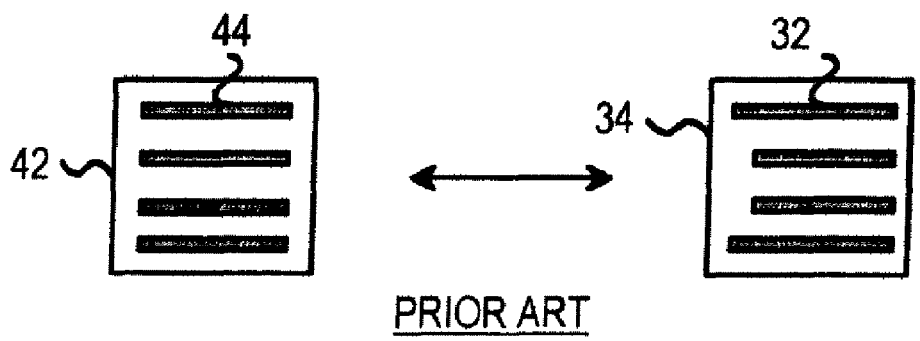
Figure 4B:
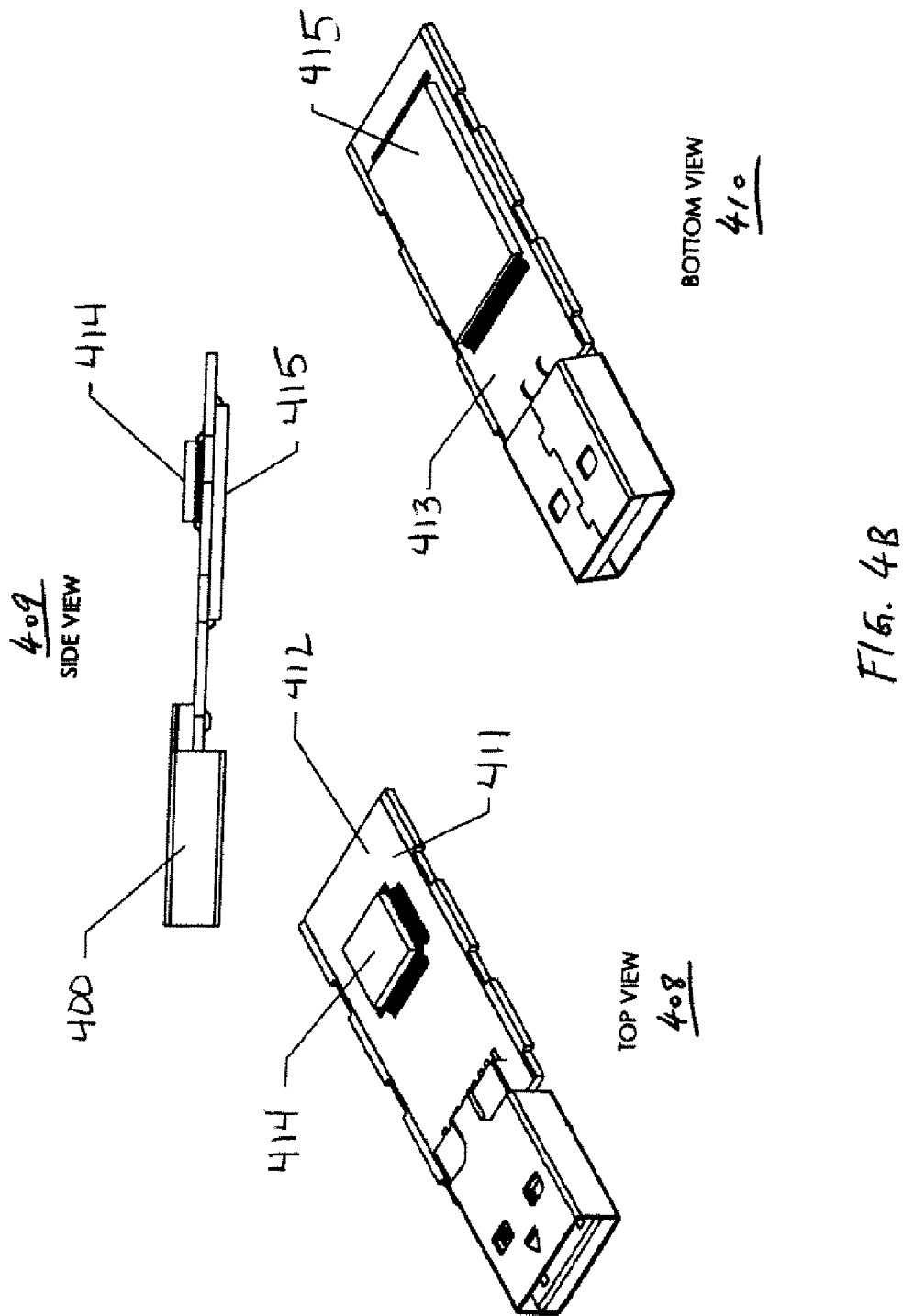

FIGS. 4A-4B are diagrams illustrating perspective views of a USB extended plug having multiple personalities according to one embodiment of the invention. Referring to FIG. 4A, a USB extended plug is showed in a complete view 401 and an exploded view 402. In one embodiment, USB extended plug 400 includes a casing or housing 403 and a USB connector substrate 404, where the connector substrate 404 can be plugged into the casing 403. Casing 403 may be made of metal, also referred to as a metal case herein. Connector substrate 404 includes a first end having multiple electrical contact fingers or tabs 405 and a second end having multiple electrical contact pins 407. In a particular embodiment, pins 407 include 9 or more pins. Connector substrate 404 further includes one or more springs or metal contacts 406 which may be used to provide pressure to another USB connector to have physical contact with contact fingers 405 when the other USB connector is inserted into an opening of the extended USB plug.

In one embodiment, contact fingers 405 may be disposed on a top surface of connector substrate 404 and additional contact fingers 421 may be disposed on a bottom surface of connector substrate 404 as shown in bottom view 420 of FIG. 4A. For example, contact fingers 405 may be compatible with standard USB specification while the additional contact fingers 421 may be designed compatible with other interfaces such as PCI Express or IEEE 1349 specifications. As a result, extended USB plug 400 may be used for multiple different communication interfaces, also referred to as dual personalities. Further detailed information regarding the extended USB plug having dual personalities can be found in certain above-referenced applications and/or patents, such as, for example, U.S. Pat. No. 7,021,971 and U.S. patent application Ser. No. 11/864,696, filed Sep. 28, 2007, which have been incorporated by reference.

Referring now to FIG. 4B, where extended USB plug 400 may be attached to a PCBA having a memory device and a memory controller for controlling the memory device. As shown in FIG. 4B as top view 408, side view 409, and bottom view 410, extended USB plug 400 may be attached to PCB substrate 411, for example, by soldering pins 407 on the PCB substrate 411. In addition, a memory device such as flash memory device may be disposed on a surface of the PCB substrate 411 and a memory controller such as a flash controller may be disposed on the other surface of the PCB substrate 411. In this example, memory device 415 is disposed on a bottom surface 413 of PCB substrate 411 and memory controller 414 is disposed on a top surface 412 of PCB substrate 411. In one embodiment, memory device 415 may be an MLC compatible memory IC and controller 414 may be an MLC compatible memory controller IC.

Figure 4C:
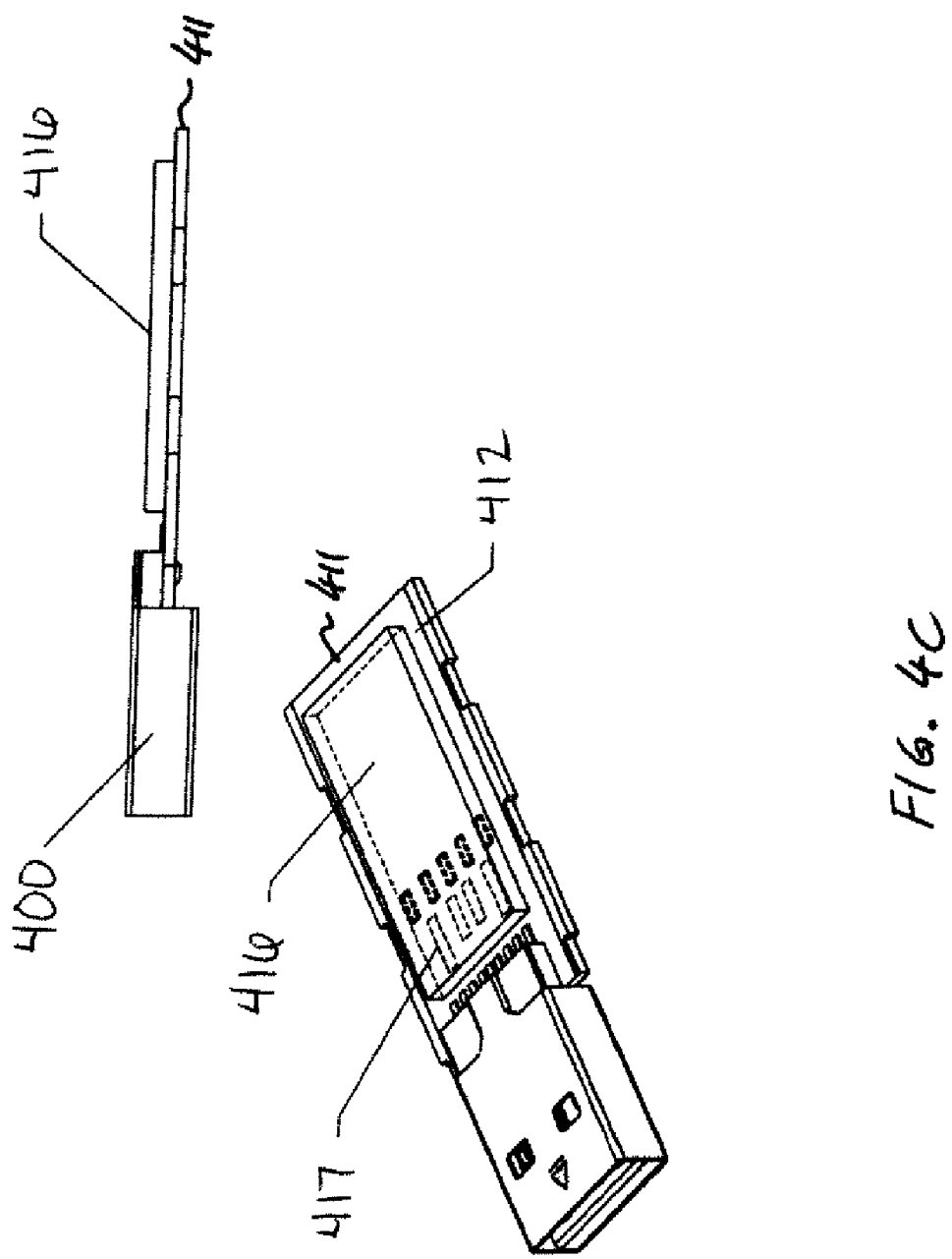

According to a further embodiment, techniques as described with respect to FIGS. 4A-4B may also be applied to a configuration where a flash memory and a flash controller are integrated into a single package such as a chip on board (COB) package as shown in FIG. 4C. Referring to FIG. 4C, a COB package 416, which may an MLC package, may be disposed on a surface such as a top surface 412 of PCB substrate 411, where the COB package 416 may be attached (e.g., soldered) via one or more contact fingers 417 disposed on a surface of COB 416. COB 416 may be any of the COB packages such as, for example, as those shown in FIGS. 6A-6B.

Figure 5B:
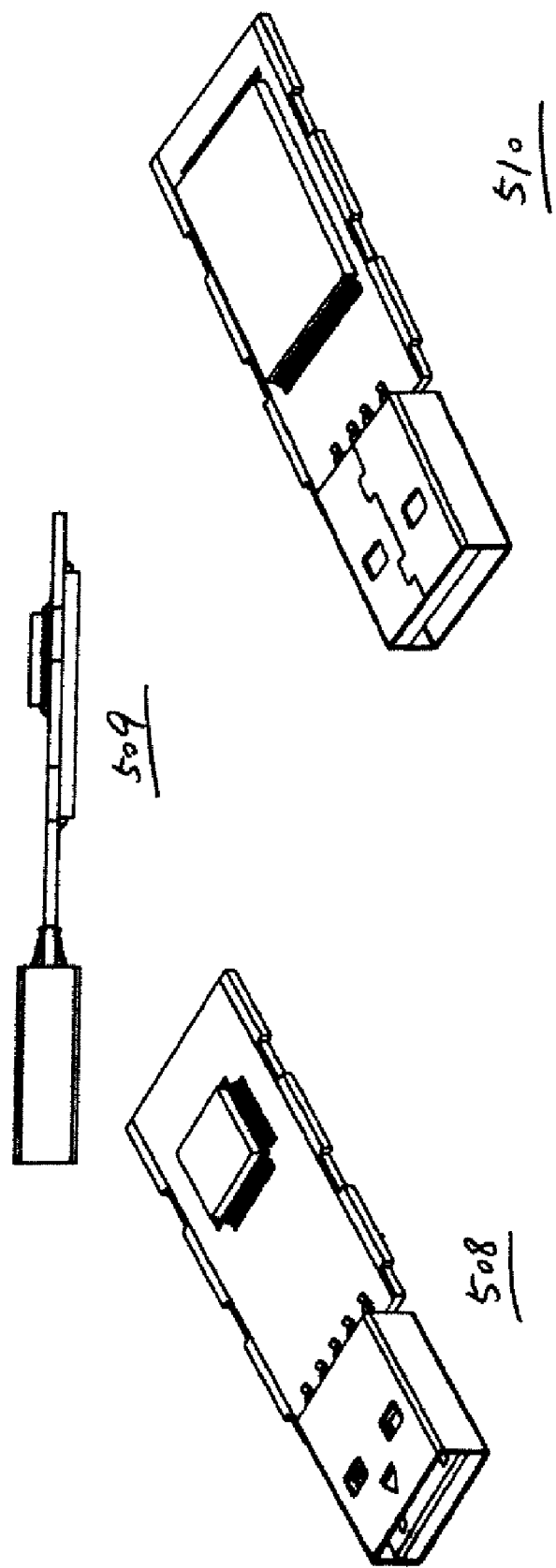

FIGS. 5A and 5B are diagrams illustrating perspective views of a USB extended plug having multiple personalities according to another embodiment of the invention. Referring to FIG. 5A, a USB extended plug is showed in a complete view 501 and an exploded view 502. In one embodiment, similar to extended USB plug 400 of FIGS. 4A-4B, extended USB plug 500 includes a casing or housing 503 and a USB connector substrate 504, where the connector substrate 504 can be plugged into the casing 503. Casing 503 may be made of metal, also referred to as a metal case herein. Connector substrate 504 includes a first end having multiple electrical contact fingers or tabs 505 and a second end having multiple electrical contact pins 507. In one embodiment, pins 507 include multiple rows of pins, each having multiple pins. In a particular embodiment, pins 507 include a first row and a second row, where the first row includes 5 pins and the second row includes 4 or more pins. Connector substrate 504 further includes one or more springs or metal contacts 506 which may be used to provide pressure to another USB connector to have physical contact with contact fingers 505 when the other USB connector is inserted into an opening of the extended USB plug.

In one embodiment, similar to extended USB plug 400, contact fingers 505 may be disposed on a top surface of connector substrate 504 and additional contact fingers (not shown) may be disposed on a bottom surface of connector substrate 504. For example, contact fingers 505 may be compatible with standard USB specification while the additional contact fingers may be designed compatible with other interfaces such as PCI Express or IEEE 1349 specifications. As a result, extended USB plug 500 may be used for multiple different communication interfaces, also referred to as dual personalities.

Referring now to FIG. 5B, where extended USB plug 500 may be attached to a PCBA having a memory device and a memory controller for controlling the memory device. As shown in FIG. 5B as top view 508, side view 509, and bottom view 510, extended USB plug 500 may be attached to PCB substrate, for example, by soldering pins 507 on the PCB substrate. In this example as shown in side view 509, the first row of pins 507 may be soldered on a top surface of the PCB substrate while the second row of pins 507 may be soldered on a bottom surface of the substrate, or vice versa. In addition, a memory device such as flash memory device may be disposed on a surface of the PCB substrate and a memory controller such as a flash controller may be disposed on the other surface of the PCB substrate. In this example, similar to the configuration as shown in FIGS. 4A-4B, a memory device is disposed on a bottom surface of PCB substrate and a memory controller is disposed on a top surface of PCB substrate. Further, the memory device may be an MLC compatible memory IC and the controller may be an MLC compatible memory controller IC.

Figure 5C:
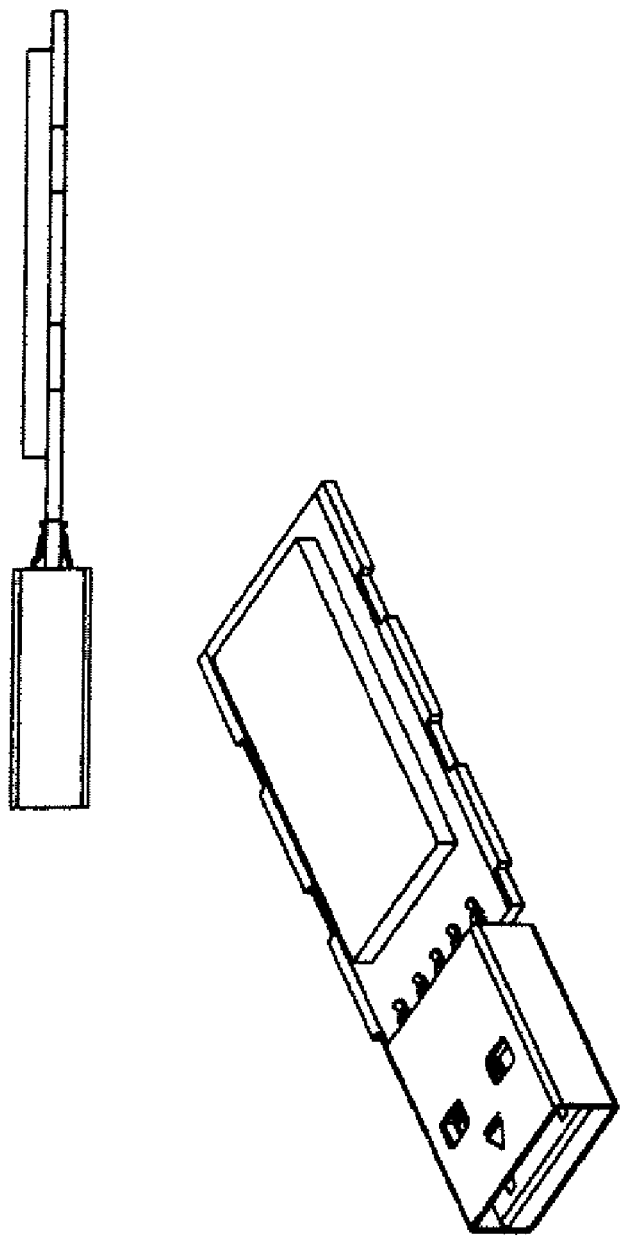
Figure 6A:
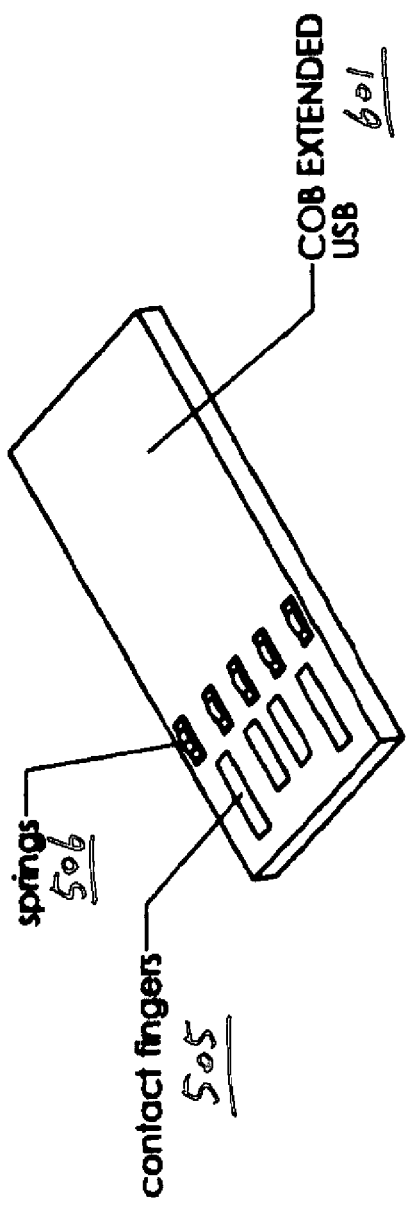
FIGS. 6A-6B are block diagrams illustrating certain form factors of a chip-on-bard (COB) package according to one embodiment of the invention.
Figure 6B:
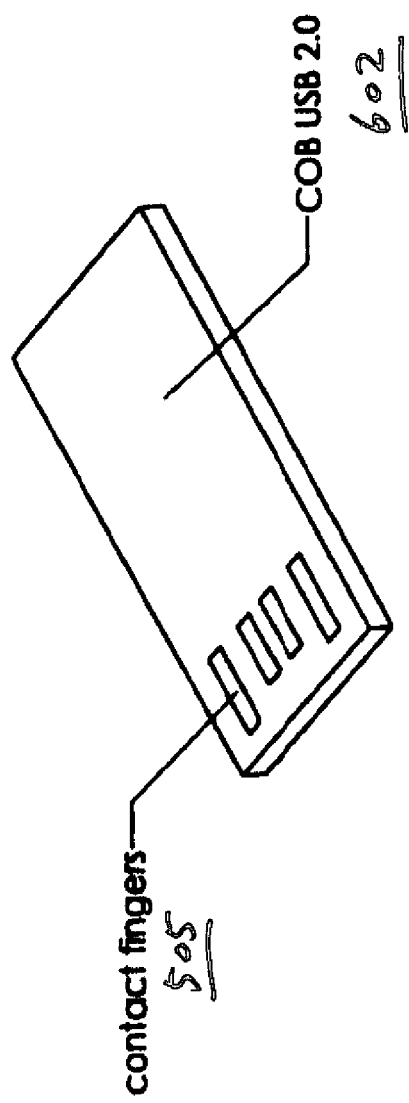

Similarly, according to a further embodiment, techniques as described with respect to FIGS. 5A-5B may also be applied to a configuration where a flash memory and a flash controller are integrated into a single package such as a chip on board (COB) package as shown in FIG. 5C, where a COB package may be any of the COB packages such as, for example, COB Extended USB package 601 or COB USB 2.0 compatible package 602 as shown in FIGS. 6A-6B. Other configurations may also exist.

According to certain embodiments of the invention, the techniques described above with respect to FIGS. 4A-4C and 5A-5C can be used in designing an extended USB portable storage device. FIG. 7 is a block diagram illustrating an example of an extended USB device having an extended USB plug with multiple personalities according to one embodiment of the invention. Referring to FIG. 7, USB package 703 which may include an extended USB plug 701 having multiple interfaces or personalities as described and a PCBA 704 may be enclosed by a housing as an extended USB device 700. Note that package 703 may be an apparatus as described in FIGS. 4A-4B or alternatively, as an apparatus as shown in FIGS. 5A-5C. The housing for housing the package 703 includes a top housing 705 and a bottom housing 706. The top housing 705 and the bottom housing 706 may be attached to each other via a variety of methods, including using a snap together method or applying ultrasonic press for sealing around edges of top housing 705 and bottom housing 706.

Figure 8A:
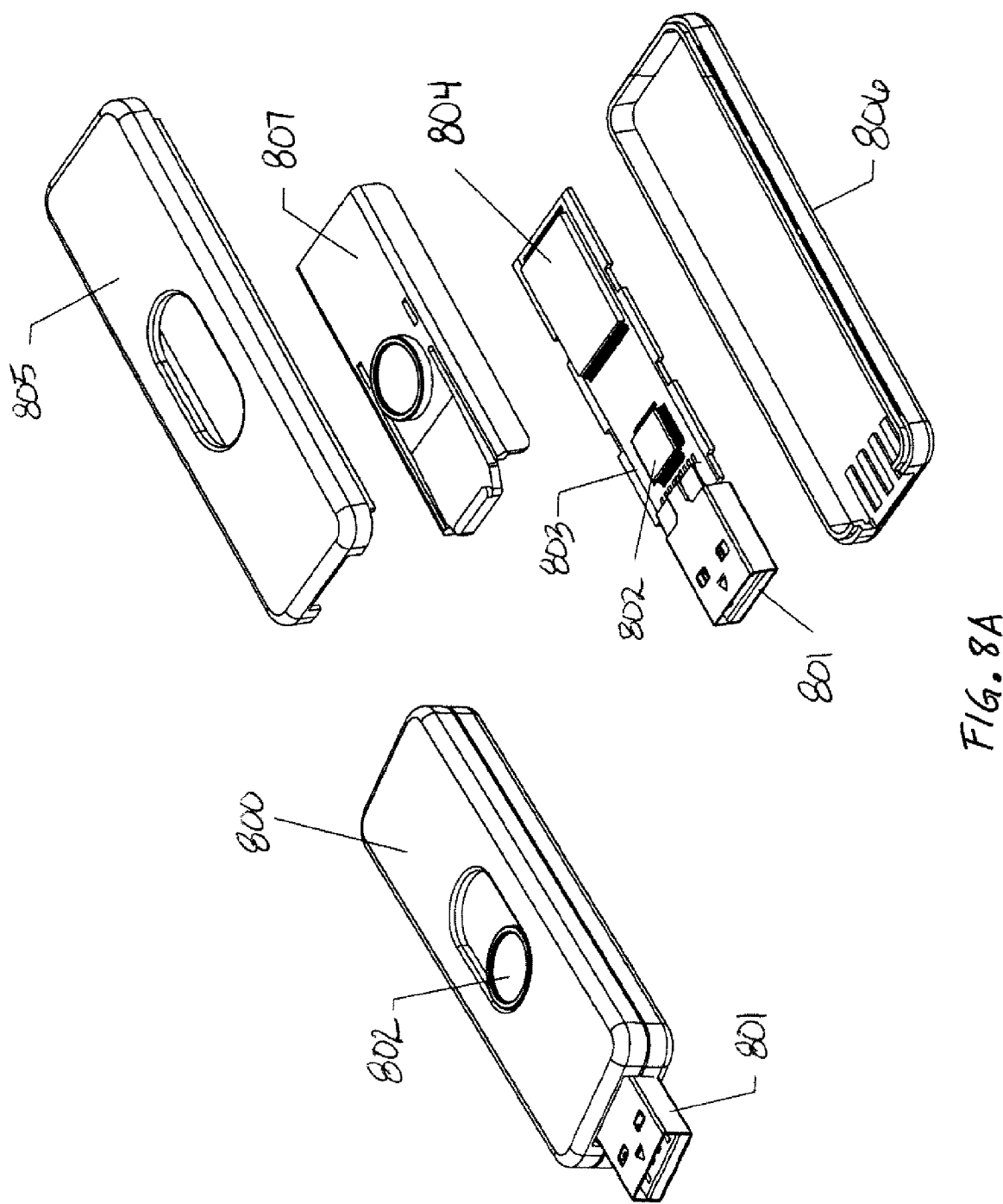
FIGS. 8A-8B are block diagrams illustrating an extended USB device according to certain embodiments of the invention.
Figure 8C:
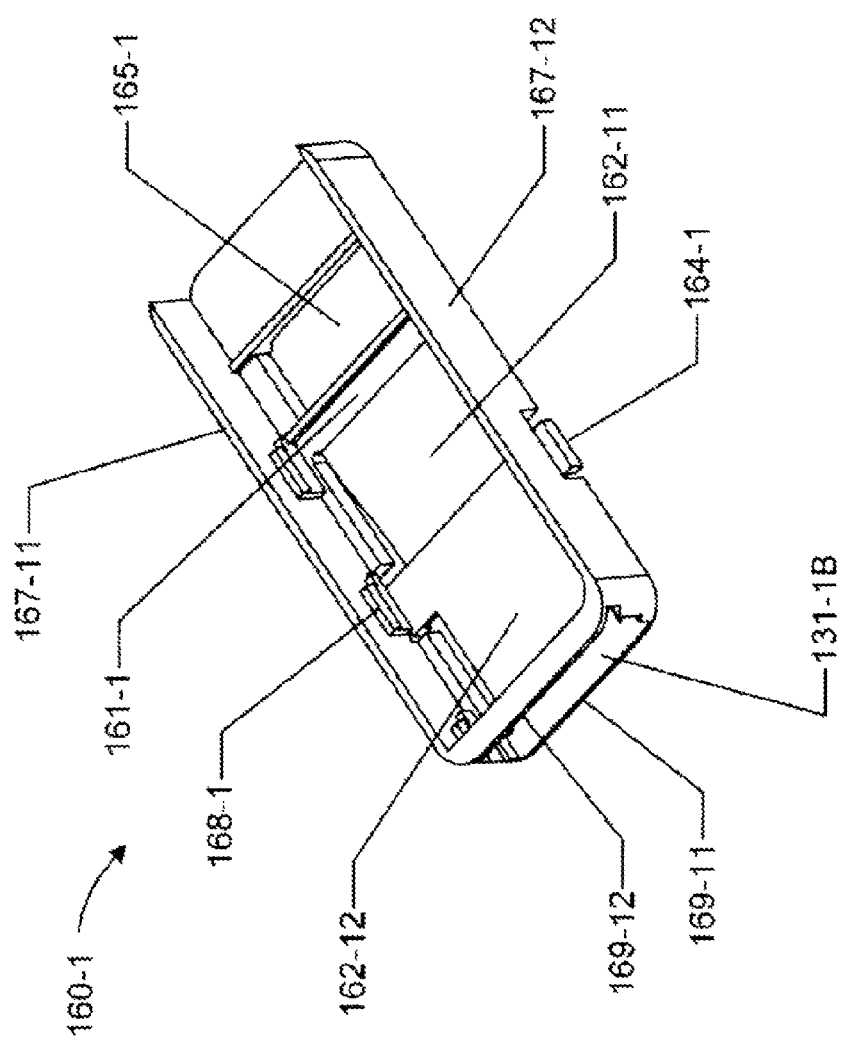
Figure 9:
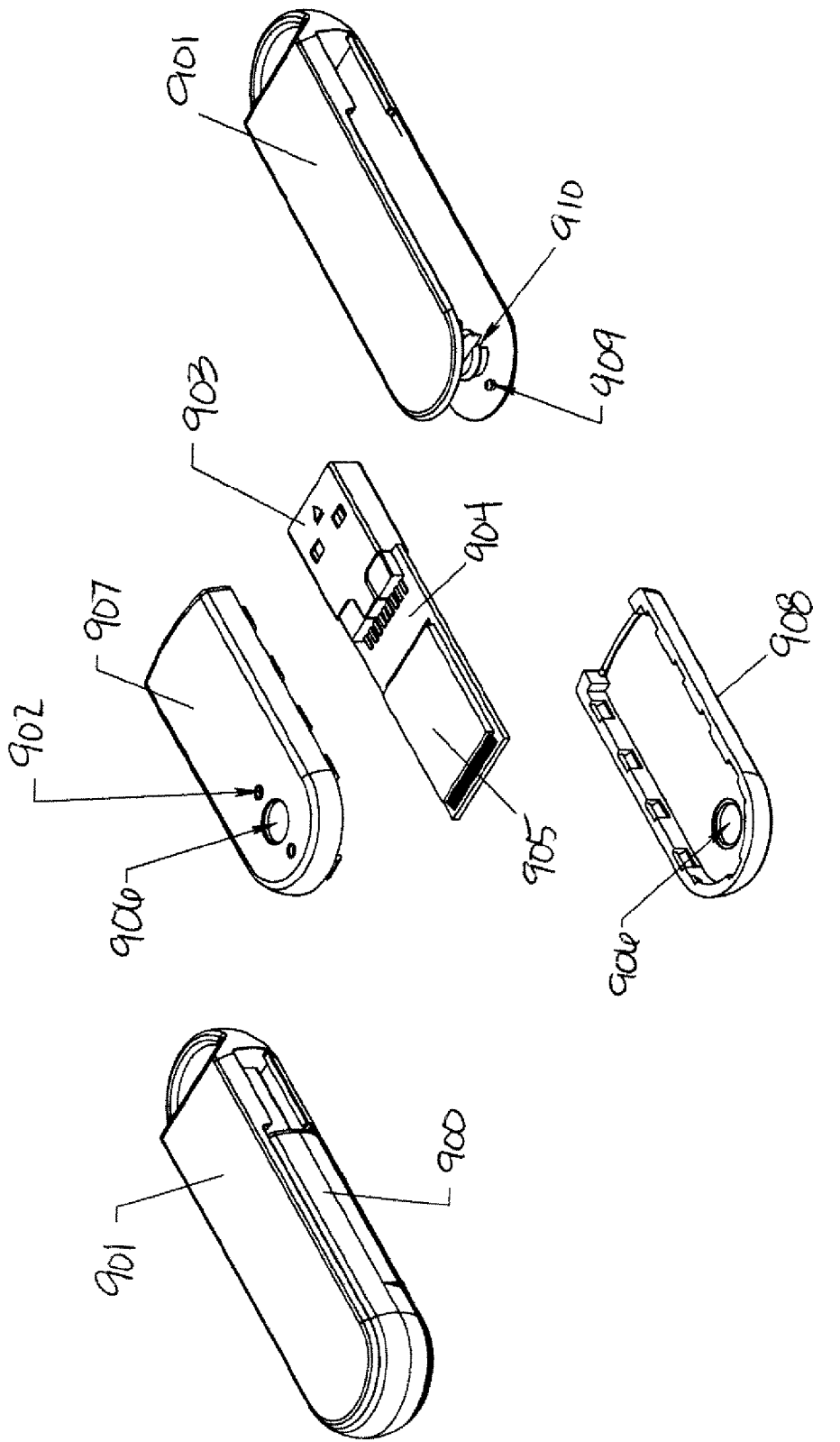
FIG. 9 is a block diagram illustrating an extended USB device according to another embodiment of the invention.

Note that extended USB device 700 as shown in FIG. 7 may be implemented in a variety of configurations, such as, those as shown in FIGS. 8A-8B and 9. FIGS. 8A-8B are block diagrams illustrating examples of USB devices having an extended USB plug with multiple interfaces or personalities. Referring to FIG. 8A, extended USB device 800 includes an extended USB plug 801 as described above and a press/push button 802 that can be used to push and/or pull the extended USB plug 801 as well as the attached herein PCBA 803 having a flash memory controller 802 (e.g., MLC controller) and a memory IC 804 (e.g., MLC memory IC) in and out of a housing of extended USB device 800. The housing includes a top housing 805 and a bottom housing 806 which may be attached together via a snap together method or via ultrasonic sealing. In addition, extended USB device 800 includes a PCB holder 807 to maintain a press/push mechanism to deploy and retract USB plug in and out of the housing.

According to an alternatively embodiment as shown in FIG. 8B, a press/push button may be implemented on a side surface. Referring to FIG. 8B, extended USB device 850 includes an extended USB plug 851 as described above and a press/push button 857 that can be used to push and/or pull the extended USB plug 851 as well as the attached herein PCBA 853 having a flash memory controller 852 (e.g., MLC controller) and a memory IC 854 (e.g., MLC memory IC) in and out of a housing of extended USB device 850. The housing includes a top housing 855 and a bottom housing 856 which may be attached together via a snap together method or via ultrasonic sealing. In addition, extended USB device 800 includes a PCB holder 857 to maintain a press/push mechanism to deploy and retract USB plug in and out of the housing. Further detailed information regarding the press/push mechanism above can be found in a co-pending U.S. patent application Ser. No. 11/845,747, filed Aug. 27, 2007, which has been assigned to a common assignee of the present application and is incorporated by reference herein in its entirety.

Figure 14A:
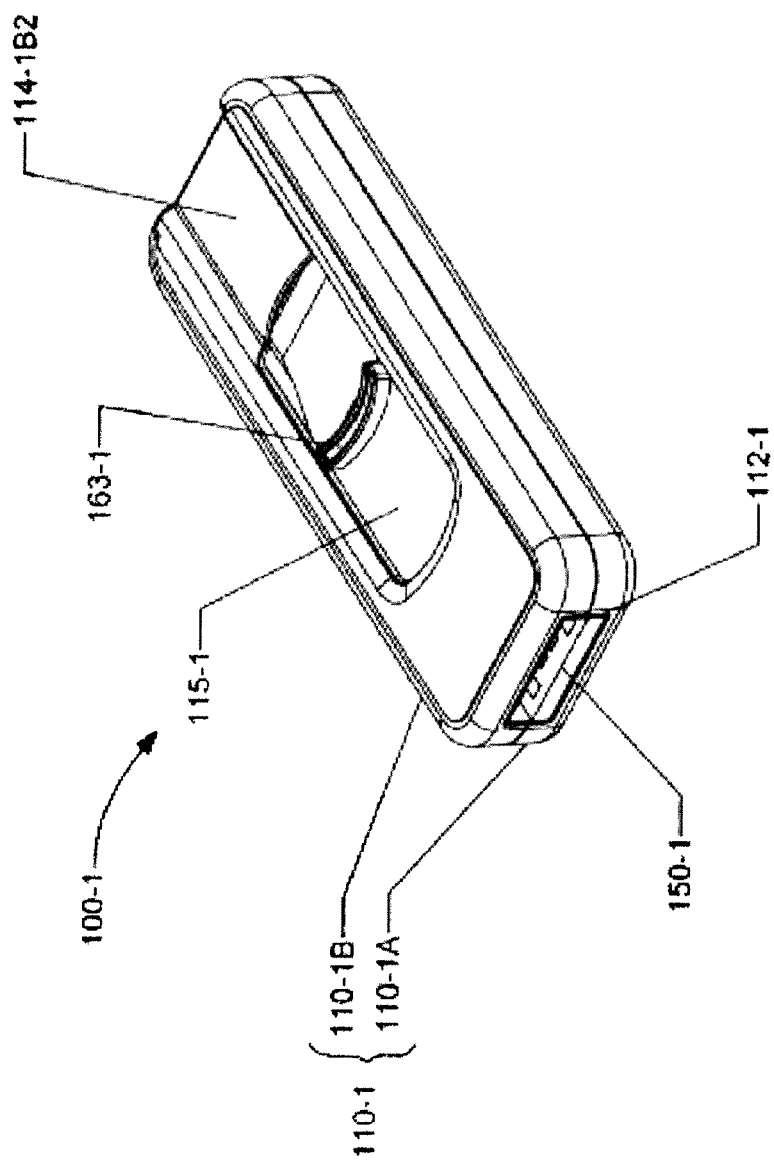
FIGS. 14(A) and 14(B) are perspective views showing a pen-type computer peripheral device in alternative closed and open positions, respectively, according to an embodiment of the present invention.
Figure 14B:
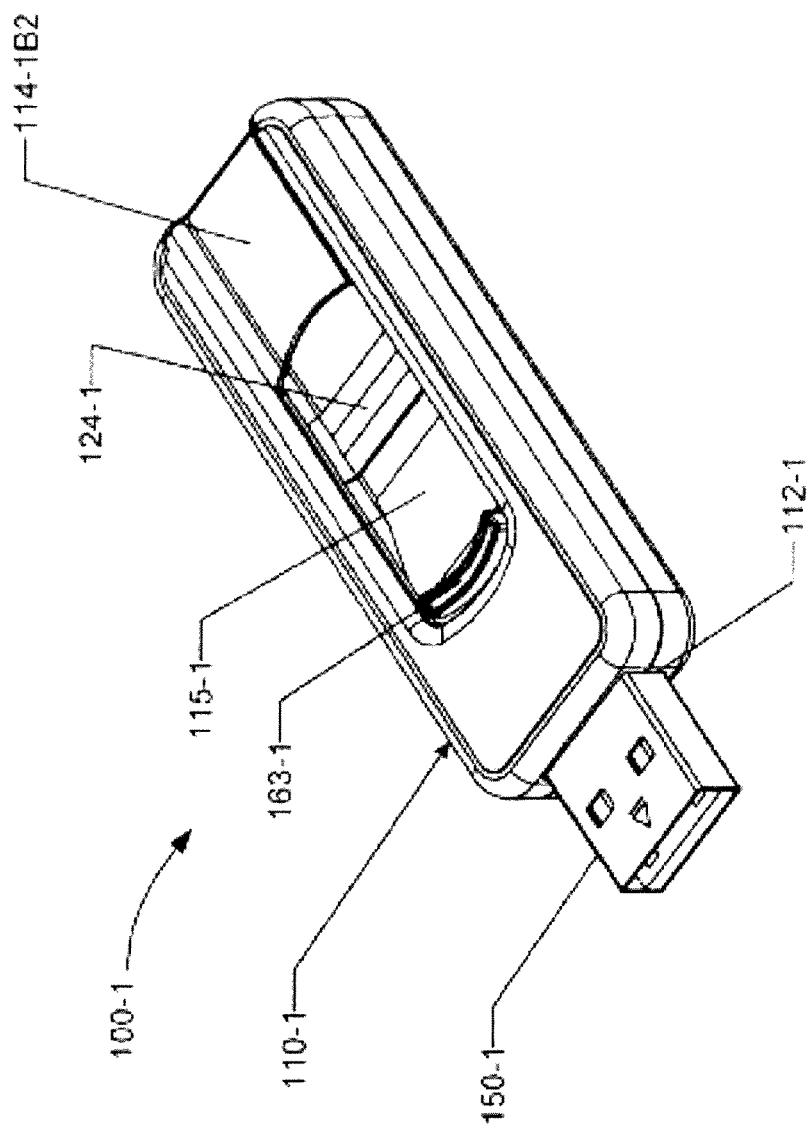

FIGS. 14(A) and 14(B) show a pocket-sized, pen-type (i.e., retractable) portable computer peripheral device 100-1 having a Universal Serial Bus (USB) plug connector 150-1 and a fingerprint detector 124-1 according to a first specific embodiment of the present invention. As shown in FIG. 14(A), in a fully retracted position, USB plug connector 150-1 is retracted through a front opening 112-1 defined by elongated housing 110-1, and the fingerprint sensor (not shown) is protectively covered (hidden) by a rear upper wall portion 114-1B2. A press-push button 163-1 is integrally connected to a positioning member (not shown, described below) and is partially exposed through a slot 115-1 to facilitate manual movement between the fully retracted (first) position shown in FIG. 14(A), and a fully deployed (second) position shown in FIG. 14(B). To deploy USB plug connector 150-1 for use, a user manually presses press-push button 163-1 into housing 110-1 (i.e., in the direction P indicated by dark arrow in FIG. 14(A)), and then pushes (slides) button 163-1 along slot 115-1 toward the front end of housing 110-1 (i.e., in the direction of arrow S in FIG. 14(A)). This press-push operation causes plug connector 150-1 to emerge from front opening 112-1. As shown in FIG. 14(B), when fully deployed for use, plug connector 150-1 extends from front opening 112-1 of housing 110-1, and fingerprint sensor 124-1 is moved forward from under rear upper wall portion 114-1B2 such that it is exposed in slot 115-1. When plug connector 150-1 and fingerprint sensor 124-1 are deployed/exposed outside housing 110-1, peripheral device 100-1 can be plugged into a host computer and function in the programming, data retrieving, and data resetting modes described above. Once the desired operations are completed, plug connector 150-1 and fingerprint sensor 124-1 are retracted into housing 110-1 by pressing press-push button 163-1, and pulling press-push button 163-1 backward along slot 115-1 (i.e., in the direction opposite to arrow S in FIG. 14(A)).

Figure 15:
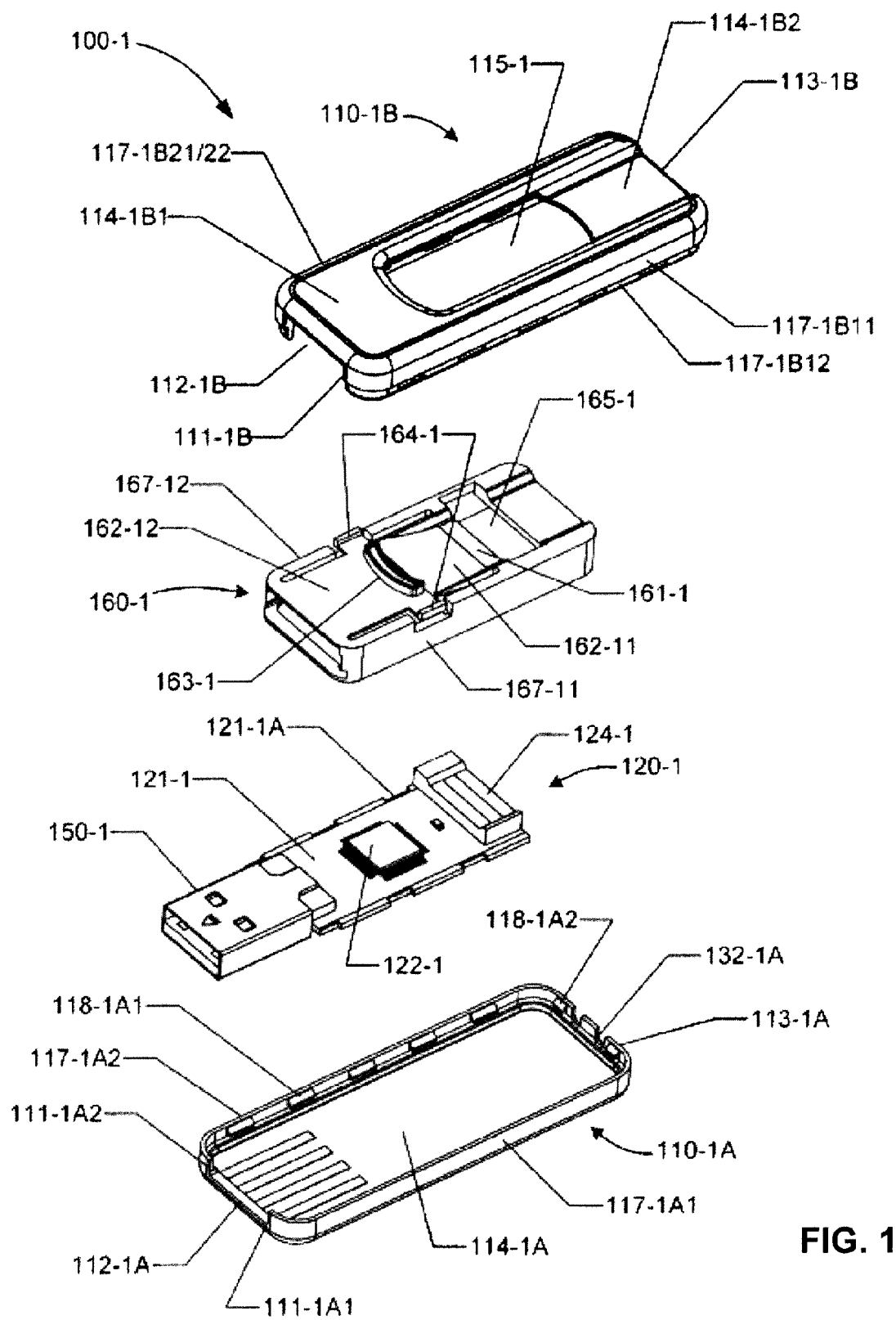
FIG. 15 is an exploded perspective view showing the peripheral device of FIG. 14.

FIG. 15 is an exploded perspective view showing device 100-1 in additional detail. Device 100-1 generally includes a rectangular two-part housing 110-1, a printed circuit board assembly (PCBA) 120-1 that is mounted inside of housing 110-1, and a manual (press-slide) positioning member 160-1 mounted on PCBA 120-1.

Referring briefly to FIG. 14(A), two-part molded plastic housing 110-1 includes a lower (first) portion 110-1A and an upper (second) portion 110-1B.

As shown at the bottom of FIG. 15, lower portion 110-1A includes a lower wall 114-1A, first side wall portions 117-1A1 and 117-1A2, a rear wall portion 113-1A, and front wall portions 111-1A1 and 111-1A2 defining a front opening portion 112-1A. Connecting tabs 118-1A1 protrude from inside surfaces of side walls 117-1A1 and 117-1A2, and connection tabs 118-1A2 are defined from inside surface of rear wall portion 113-1A. Rear wall 113-1A includes key-chain slots 132-1A.

Figure 16A:
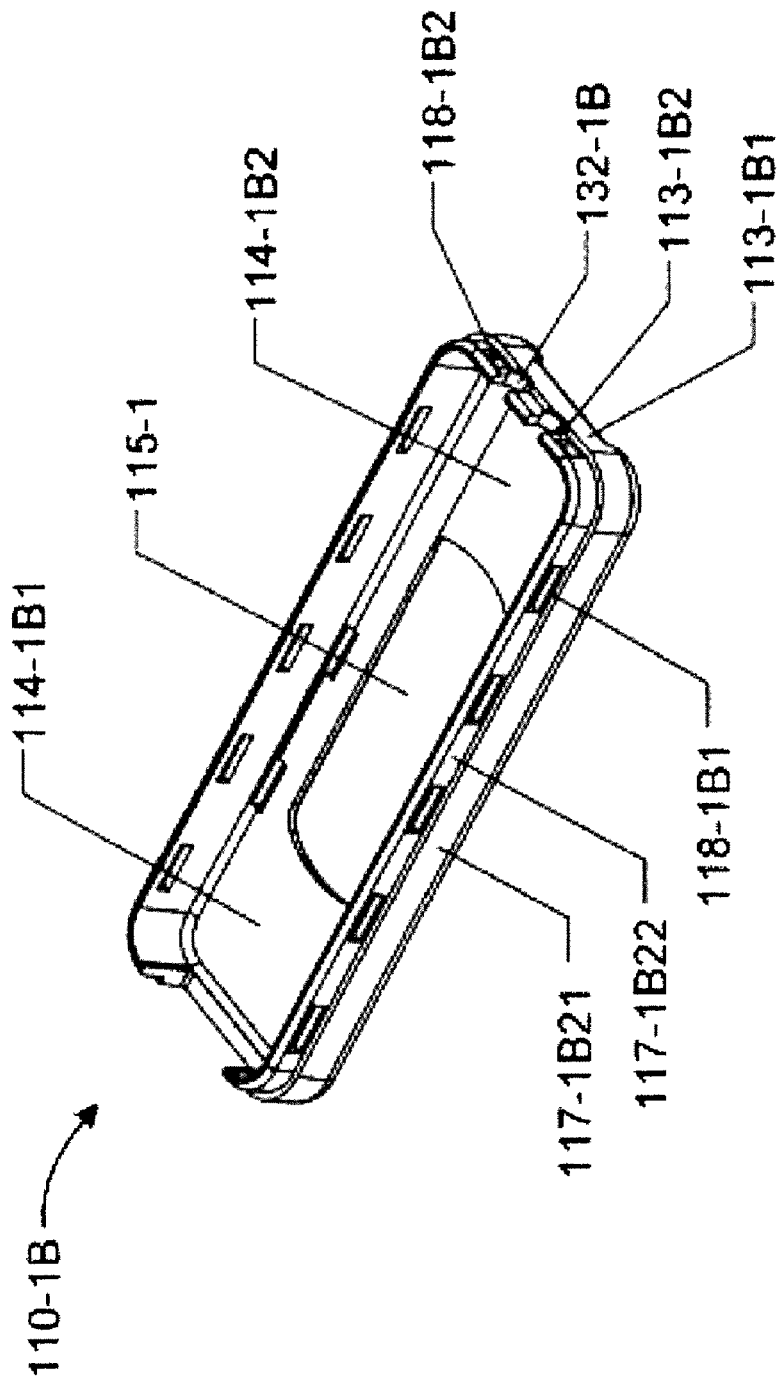
FIGS. 16(A) and 16(B) are bottom perspective views showing an upper housing portion of the peripheral device of FIG. 14.
Figure 16B:
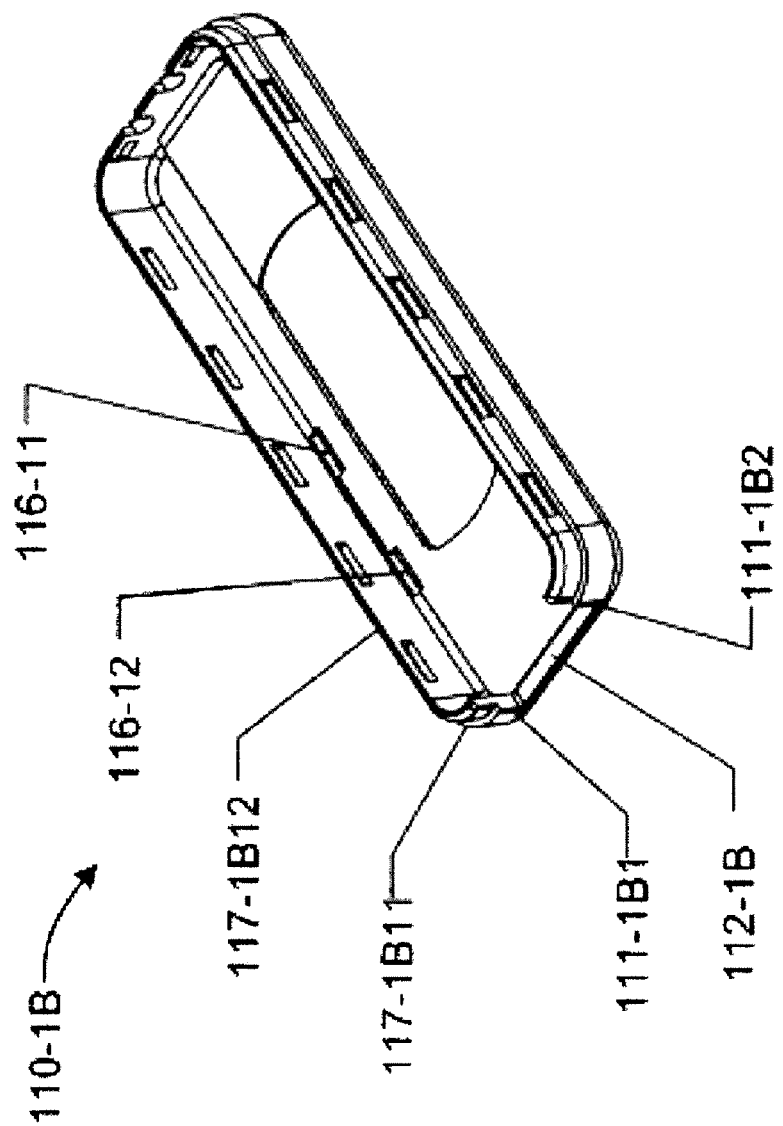

As shown at the top of FIG. 15 and in FIG. 16A, upper portion 110-1B includes a relatively wide, elongated upper wall that is divided into a front upper wall portion 114-1B1 and a rear upper wall portion 114-1B2 that are separated by a slot (finger print area cut-out) 115-1. Extending downward from the upper wall are two-part side walls including outer side walls 117-1B11 and 117-1B21 and inner walls 117-1B12 and 117-1B22, front wall portions 111-1B1 and 111-1B2 that define front opening portion 112-1B, and a rear outer wall 113-1B1. Connecting slots 118-1B1 are defined through inner side walls 117-1B12 and 117-1B22. A pair of locking slots 118-1B2 is defined through rear inner wall 113-1B2. Retracted lock grooves (second locking structures) 116-11 and deployed lock grooves (third locking structures) 116-12 are defined in an inside surface of front upper wall portion 114-1B1. Rear inner wall 113-1B2 includes key-chain protrusions 132-1B. 132-1A and 132-1B combination during the assembly process provide key-chain holes.

Referring to the center of FIG. 15, PCBA 120-1 includes a printed circuit board (PCB or card) 121-1 and a USB metal connector 150-1 that is attached to a front end of PCB 121-1 using known techniques such that PCB 121-1 is approximately aligned centered to USB metal connector 150-1. As discussed above, PCB 121-1 includes several ICs (e.g., a controller or processing unit 122-1) disposed thereon, and in the present embodiment includes a fingerprint sensor 124-1 disposed at a rear edge of PCB 121-1. The ICs and fingerprint sensor 124-1 are electronically connected together using known techniques. Cut-out clearances 121-1A are defined in side edges of PCB 121-1 for connected to positioning member 160-1, as described below.

Figure 17:
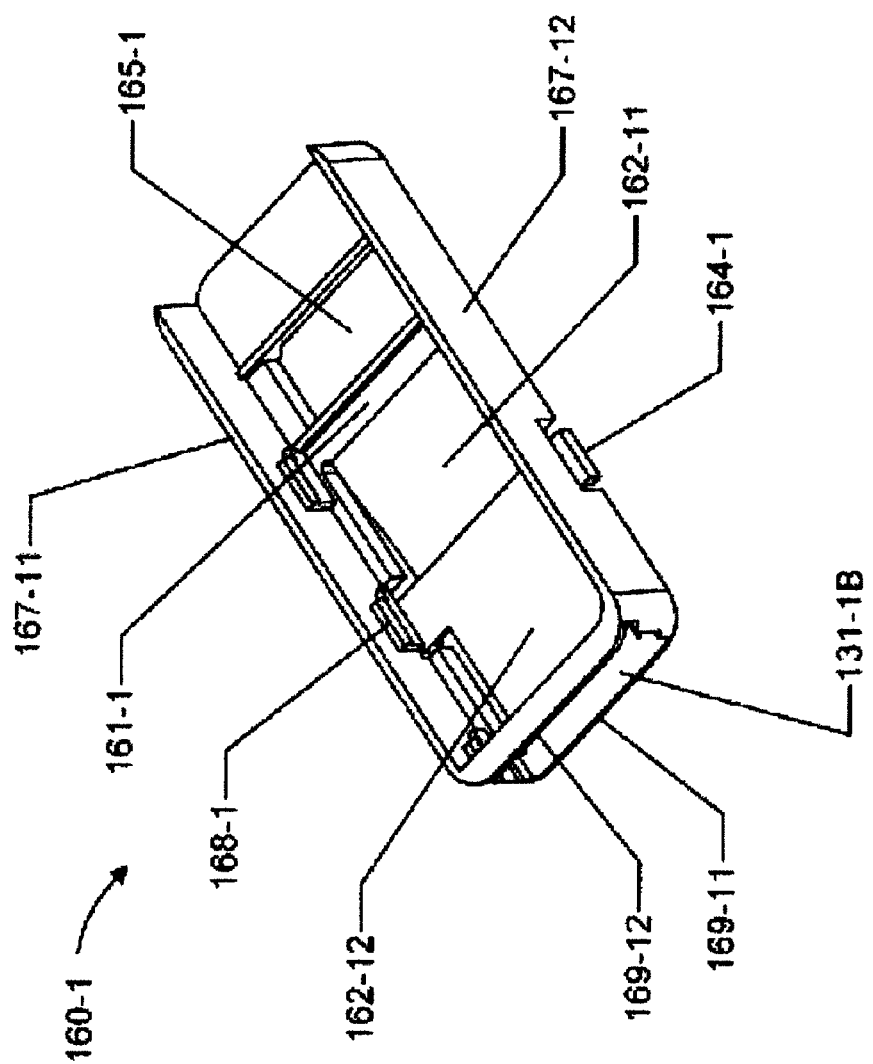
FIG. 17 is a bottom perspective view showing a positioning member of the peripheral device of FIG. 14.

Referring to the center of FIG. 15 and to FIG. 17, positioning member 160-1 includes a base portion 161-1, flexible walls 162-12/162-11 to base portion 161-1 such that flexible wall is resiliently bendable relative to base portion 161-1 in the manner described below. Press-push button 163-1 extends upward from flat flexible wall 162-12 and is disposed adjacent to flat flexible wall 162-12 and slant flexible wall 162-11. Locking tabs (first locking structures) 164-1 also extend upward from flat flexible surface 162-12 and are disposed adjacent to flat flexible wall 162-12 and slant flexible wall 162-11. Base portion 161-1 defines a sensor opening 165-1 whose purpose is described below. Referring to FIG. 17, first and second slide rails 167-11 and 167-12 are fixedly connected to and extend substantially perpendicular to base portion 161-1. Connection tabs 168-1 are fixedly connected to slide rails 167-11 and 167-12 or base portion 161-1, and are positioned to snap-couple onto PCB 121-1 such that each connection tab 168-1 extends into an associated one of cut-outs 121-1A (see FIG. 15). Front walls 169-11 and 169-2 define front opening portion 131-1B.

Figure 18A:
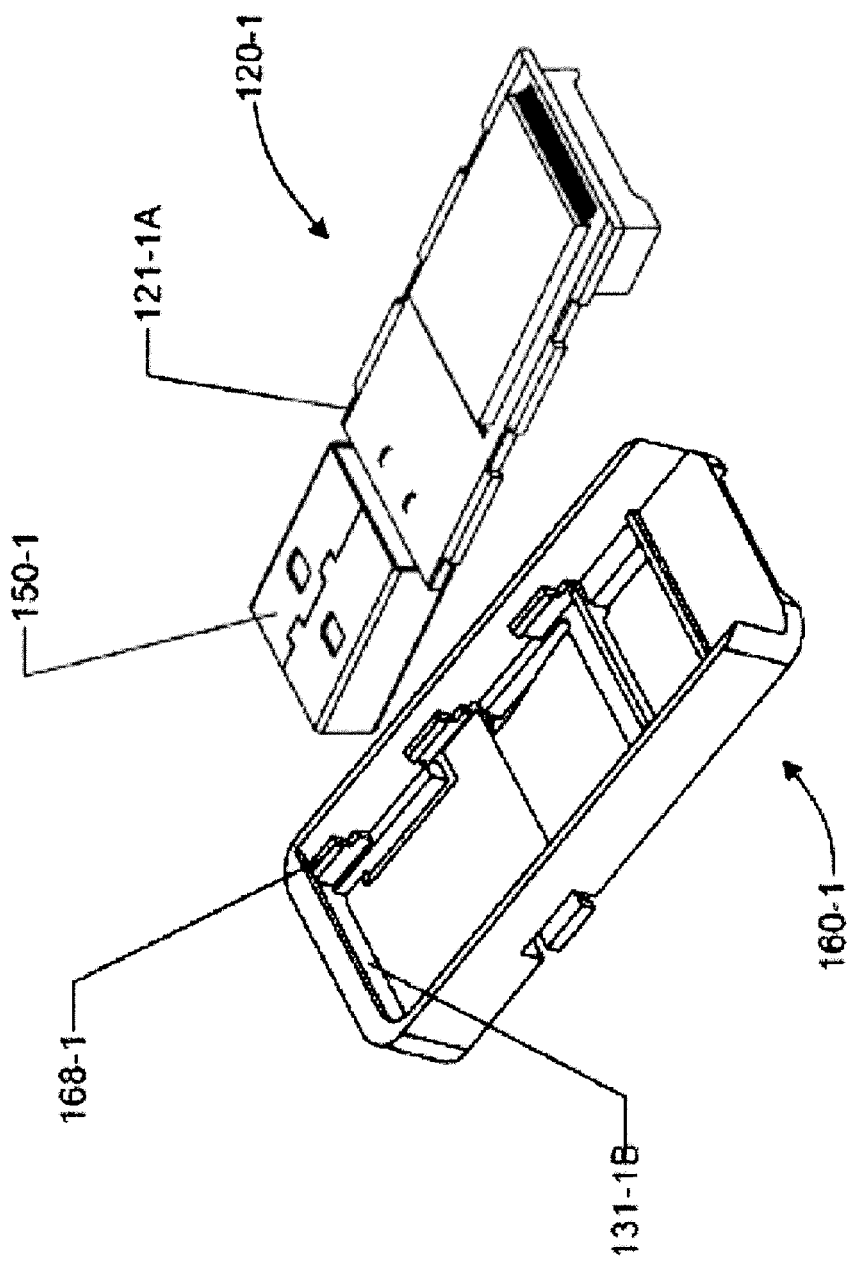
Figure 18B:
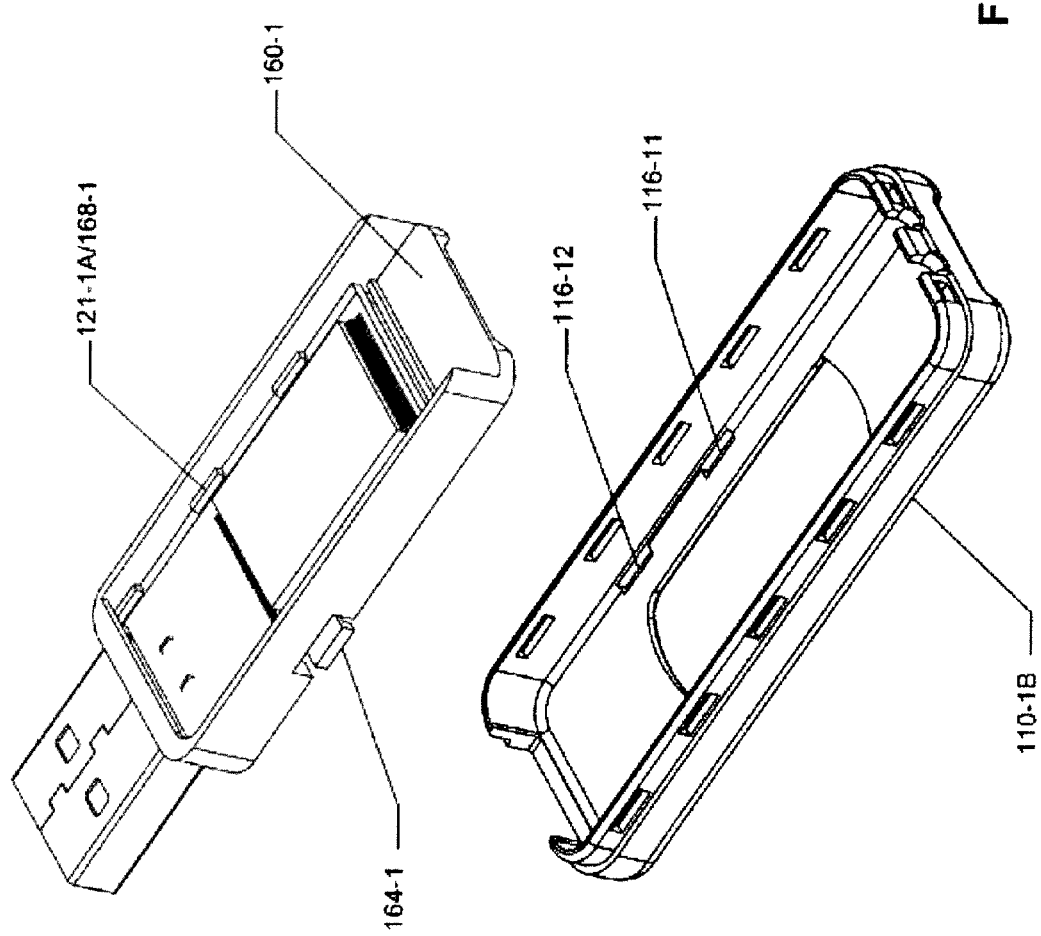

FIGS. 18(A) to 18(C) illustrate assembly of peripheral device 100-1. As shown in FIG. 18(A), PCBA 120-1 is mounted onto positioning member 160-1 with plug connector 150-1 slid through front opening portion 131-1B, next cut-out clearances 121-1A aligned with locking tabs 168-1, and then PCBA 120-1 is pressed downward until locking tabs 168-1 snap into cut-out clearances 121-1A (as shown in FIG. 18(B)). Next, as shown in FIG. 18(B), positioning member 160-1 is mounted into upper housing portion 110-1B so that locking tabs 164-1 are received in retracted position locking grooves 116-11 (as shown in FIG. 18(C)). Although not shown, a portion of the press-push button (which extends downward from flat flexible wall 162-12) is received in slot 115-1. Finally, as shown in FIG. 18(C), the side walls (e.g., side wall 117-1A) of lower housing portion 110-1A are aligned to be received between corresponding side walls (e.g., side walls 117-1B21 and 117-1B22) of upper housing portion 110-1B, and lower housing portion 110-1A is then pressed against upper housing portion 110-1B until locking tabs 118-1A1 are snapped into slots 118-1B1, and locking tabs 118-1A2 are snapped into slots 118-1B2. Note that key-chain slots 132-1A fit in key-chain protrusions 132-1B forming key-chain holes after assembly. In an alternative embodiment, ultrasonic welding may be used in place of the snap-coupling mechanism described above to secure housing portions 110-1A and 110-1B.

Figure 19A:
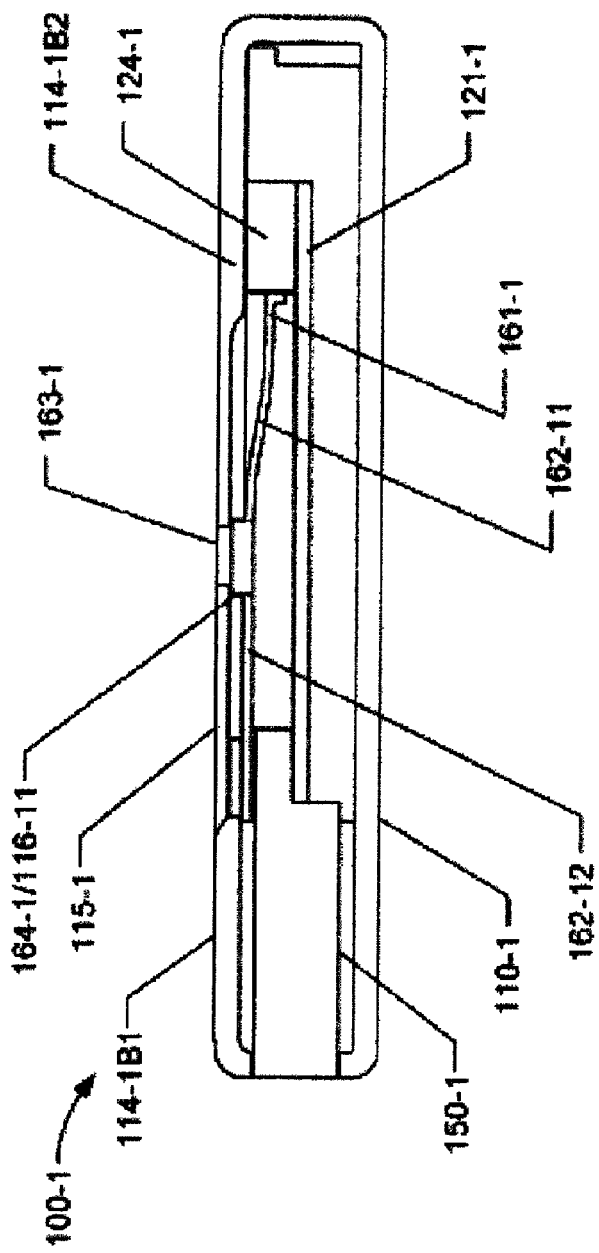
FIGS. 19(A), 19(B), 19(C) and 19(D) are simplified cross-sectional side views depicting the peripheral device of FIG. 14 during operation.
Figure 20A:
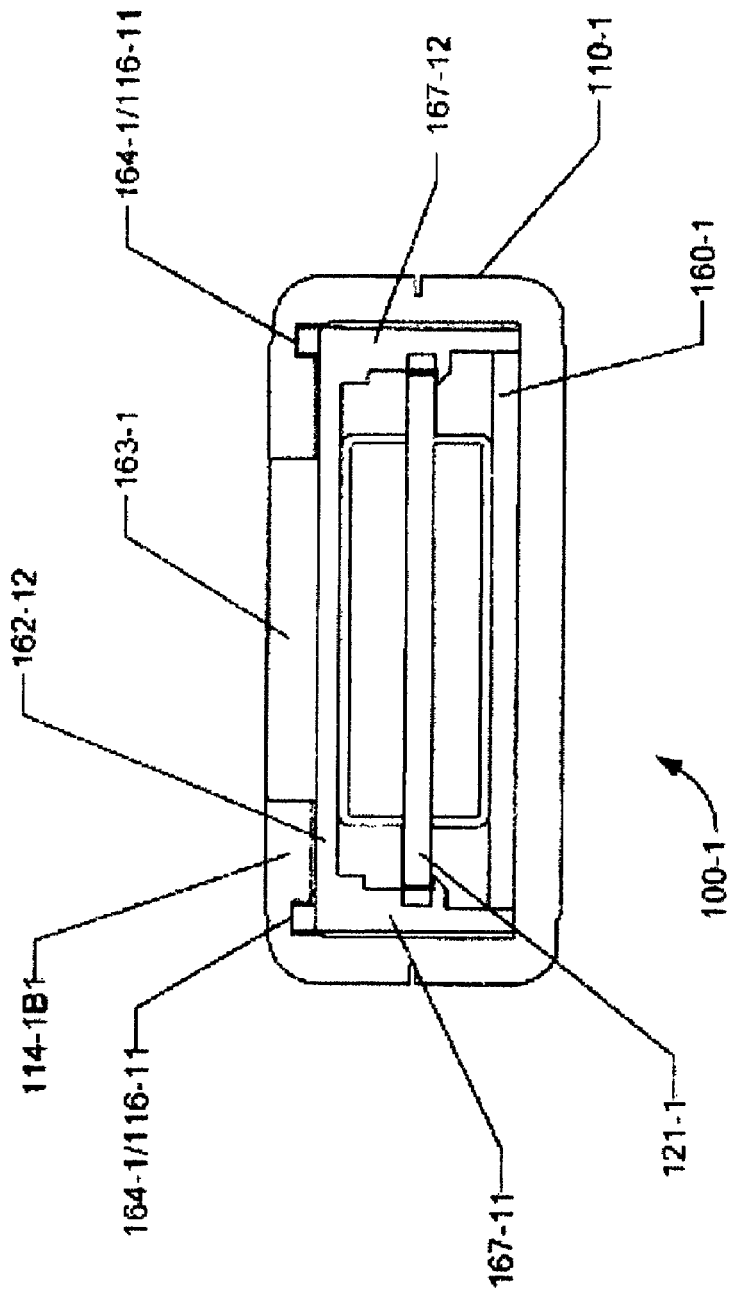
FIGS. 20(A) and 20(B) are simplified cross-sectional end views depicting the peripheral device of FIG. 14 during operation.
Figures 21A, 21B:
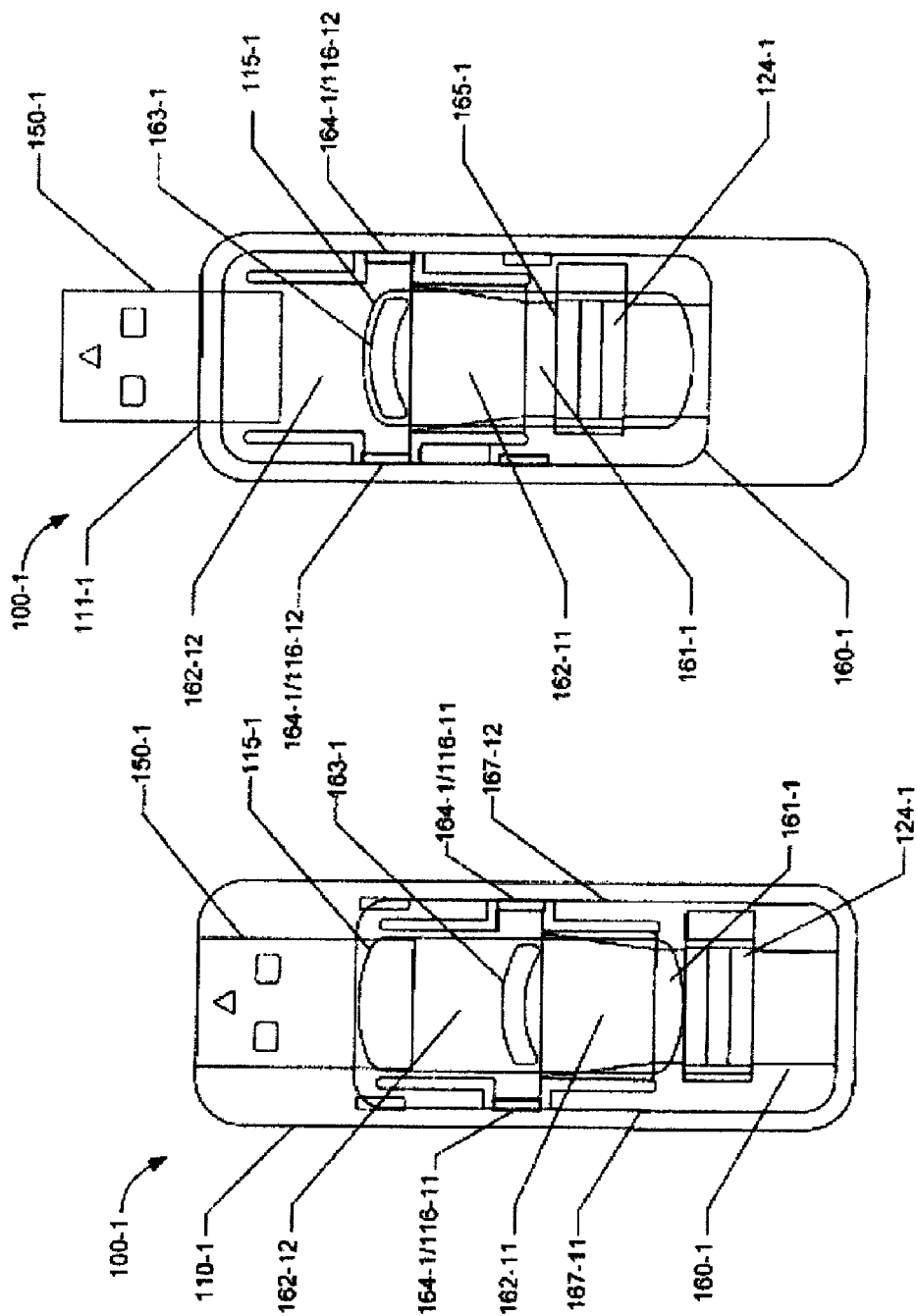
FIGS. 21(A) and 21(B) are simplified cross-sectional modified top views depicting the pen-type computer peripheral device of FIG. 14 during operation.

FIGS. 19(A), 20(A) and 21(A) are simplified cross-sectional side, front and top views, respectively, showing portions of peripheral device 100-1 in the retracted state (i.e., with plug connector 150-1 disposed inside housing 110-1). FIGS. 19(A) and 21(A) show that press-push button 163-1 extends upward from flat flexible wall 162-12 through slot 115-1, and sensor 124-1 is covered by upper wall portion 114-1B2. In addition, as indicated in each of FIGS. 19(A), 20(A) and 21(A), in the retracted position, locking tabs 164-1 are biased into retracted locking grooves 116-11, which are defined in upper wall portion 114-1B1, thereby preventing movement of positioning member 160-1 and PCB 121-1 within housing 110-1.

Figure 19B:
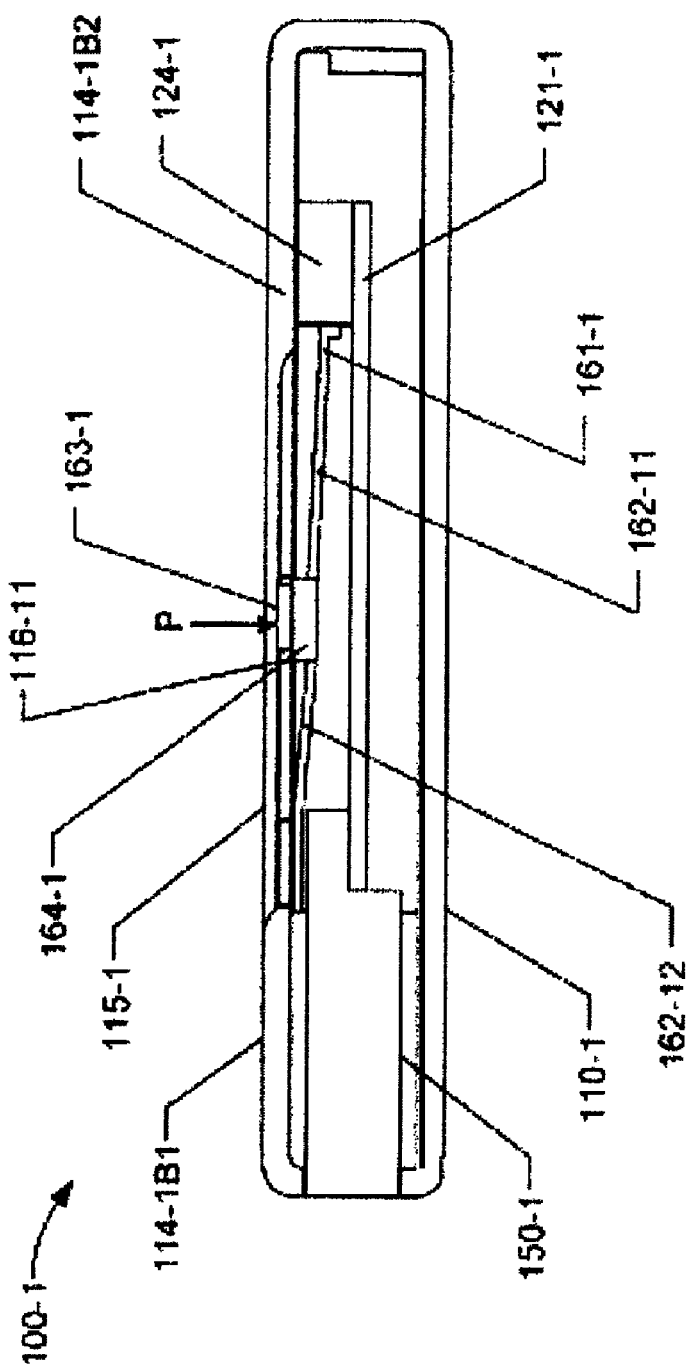
Figure 19C:
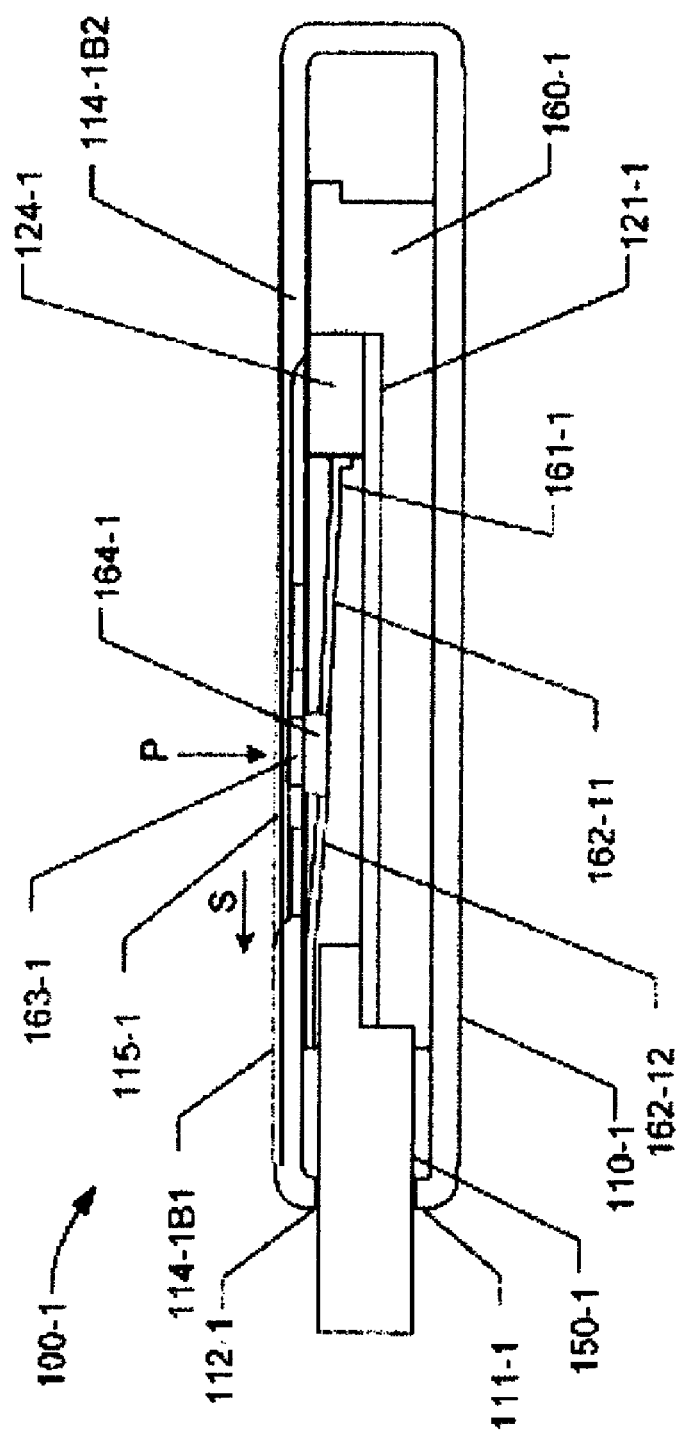
Figure 20B:
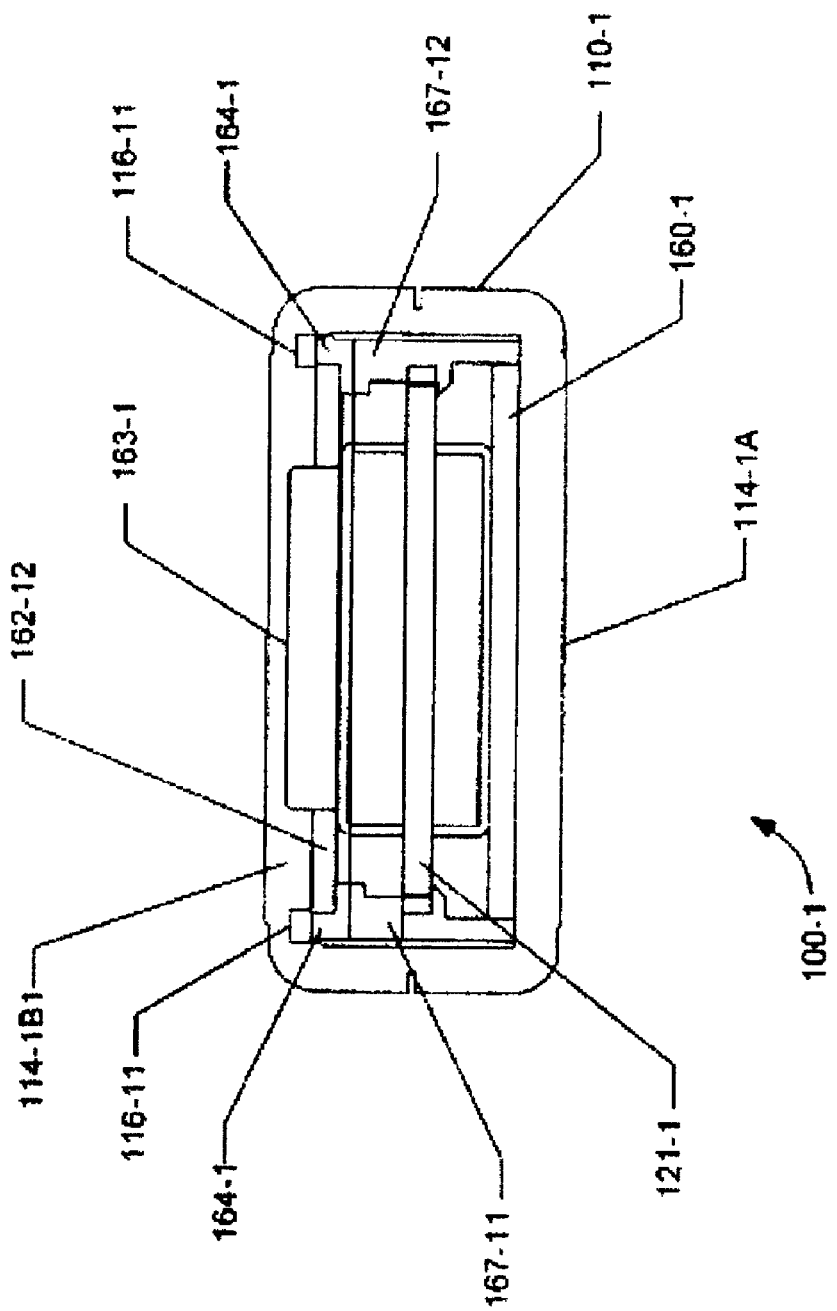

The press-push operation performed to deploy plug connector 150-1 is now described with reference to FIGS. 19(B), 19(C) and 20(B). First, a downward pressing force P is applied press-push button 163-1 (as indicated by dark arrow in FIG. 19(B)). Pressing force P causes flat flexible wall 162-12 and slant flexible wall 162-11 to bend relative to base portion 161-1 such that locking tabs 164-1 are disengaged from locking grooves 116-11 and moved away from upper wall portion 114-1B1. Referring to FIG. 20(B), the pressing force applied to the press-push button pushes slide rails 167-11 and 167-12 against an inside surface of lower housing wall 114-1A, which in turn applies resisting forces R against slide rails 167-11 and 167-2, thereby facilitating the bending of flat flexible wall 162-12 and slant flexible wall 162-11 away from upper wall portion 114-1B1. Referring to FIG. 19(C), while maintaining pressing force P, a pushing force S is also applied to press-push button 163-1, causing positioning member 160-1 and PCB 121-1 to move forward in housing 110-1 such that plug connector 150-1 begins to protrude through front opening 112-1 defined by front wall 111-1. Referring again to FIG. 20(B), note that slide rails 167-11 and 167-12 facilitate this forward movement by presenting a small resistance area on lower housing wall 114-1A. Note also that, because the pressing force P applied to press-push button 163-1 is applied to lower wall 114-1A by way of slide rails 167-11 and 167-12, and because PCB 121-1 is supported by positioning structure (i.e., instead of being supported along the PCB edges in a groove formed in housing 110-1), none of the pressing force is applied to PCB 121-1, thereby providing reliable and durable operation of peripheral device 100-1.

Figure 19D:
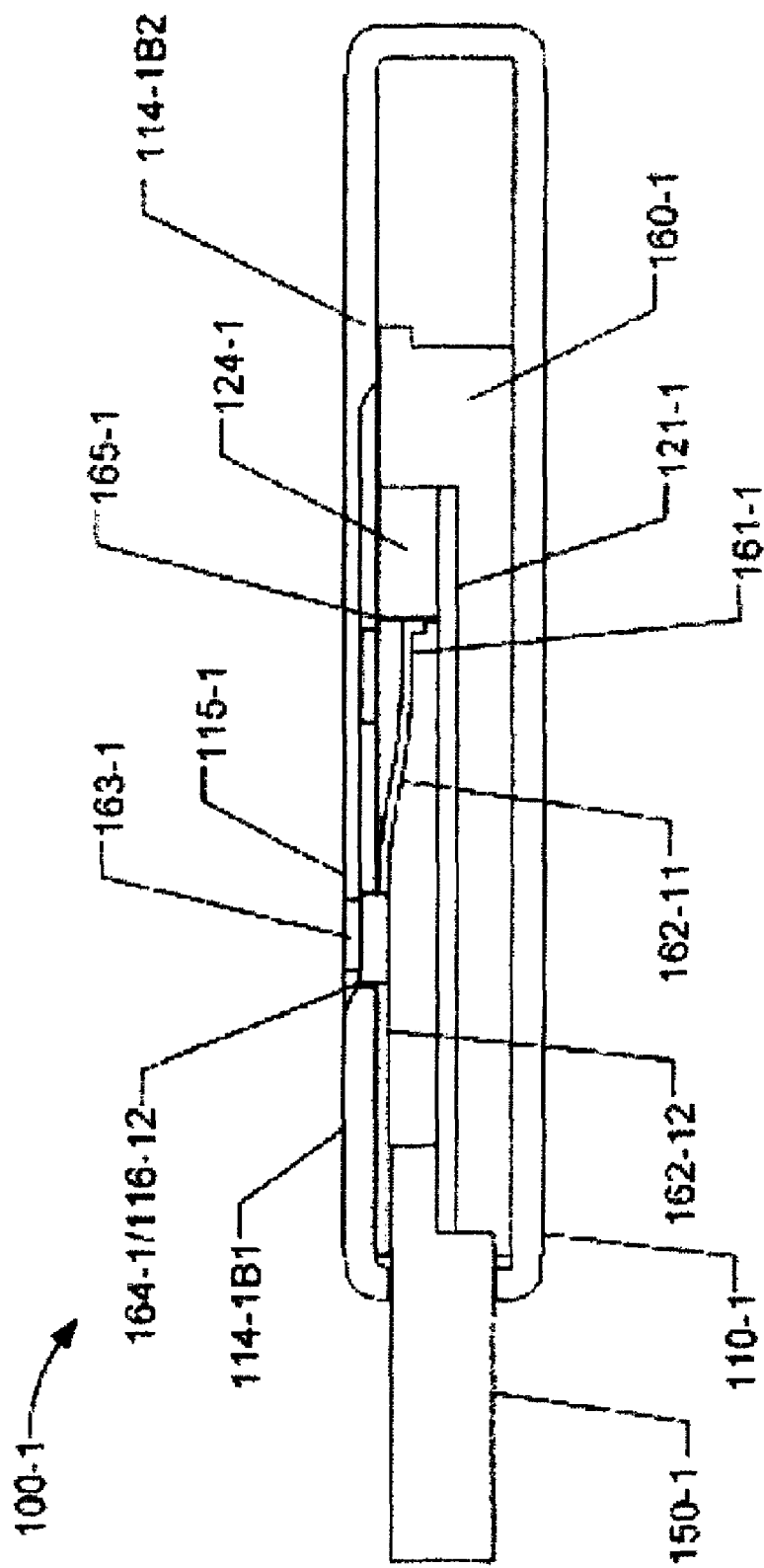

FIGS. 19(D) and 21(B) show peripheral device 100-1 at the end of the press-push operation, when plug connector 150-1 is in the fully deployed position outside of housing 110-1 and locking tabs 164-1 are engaged locking grooves 116-12. Note that, with the pressing force released, flat flexible wall 162-12 and slant flexible wall 162-11 resiliently bias locking tabs 164-1 upward, causing locking tabs 164-1 to engage locking grooves 116-12. In the deployed position, fingerprint sensor 124-1 is exposed through slot 115-1 and sensor opening 165-1 to perform the fingerprint sensing operation described above.

To return peripheral device to the retracted position, press-push button 163-1 is pressed to pop locking tabs 164-1 out of deployed lock groove 116-12, and then button 163-1 is pulled/pushed backward along slot 115-1 until locking tabs 164-1 snap into retracted lock grooves 116-11.

FIG. 9 is a block diagram illustrating an example of extended USB device having an extended USB plug with multiple personalities according to one embodiment of the invention. Referring to FIG. 9, extended USB device 900 is a MLC compatible USB flash drive in which a swivel cap 901 is attached to the extended USB device 900 by a pivot pin with at least two locking positions 902.

Referring to FIG. 9, extended USB flash drive 900 includes a dual-personality extended USB plug 903 as described above and a PCBA 904 with MLC flash memory and/or controller IC 905. Specifically, USB flash drive includes an extended USB device 900 and a swivel cap 901 which is attached to the extended USB device 900 by pressing pivot pins 910 (swivel cap) into pivot holes 906 (top/bottom housing). Locking positions of swivel cap related to the USB device are obtained whenever lock pins 909 (swivel cap) snap into lock holes (top/bottom housing). The extended USB device 900 includes a top, bottom housing 907-908 and a PCBA 904 as described above. The assembly of top and bottom housing 907-908 utilizes snap-together method or apply ultrasonic press for sealing around edges of housing 907-908. Other configurations may exist.

Figure 10A:
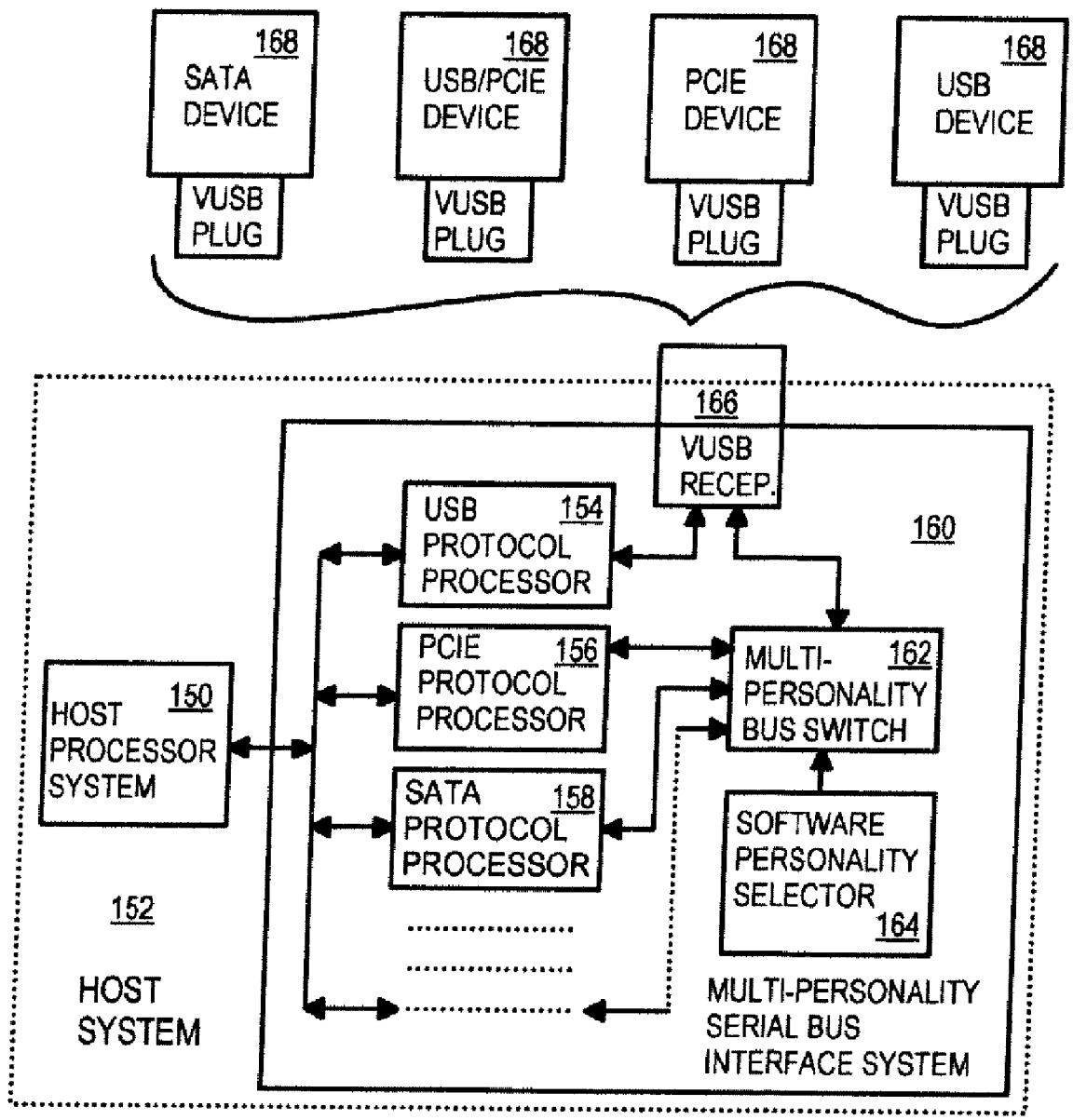
FIG. 10A is a block diagram of a host with an extended-USB socket that supports extended-mode communication according to one embodiment of the invention.

FIG. 10A is a block diagram of an exemplary host with one embodiment of an extended-USB socket that supports extended-mode communication. The configuration as shown in FIG. 10A may be utilized with embodiments of techniques described above. A variety of extended-USB or USB peripherals 168 could be plugged into extended-USB socket 166 of host 152. For example, a SATA peripheral, a PCI-Express peripheral, a Firewire IEEE 1394 peripheral, a Serial-Attached SCSI peripheral, or a USB-only peripheral could be inserted. Each can operate in its own standard mode.

Host 152 has processor system 150 for executing programs including USB-management and bus-scheduling programs. Multi-personality serial-bus interface 160 processes data from processor system 150 using various protocols. USB processor 154 processes data using the USB protocol, and inputs and outputs USB data on the USB differential data lines in extended USB socket 166.

The extended metal contact pins in extended USB socket 166 connect to multi-personality bus switch 162. Transceivers in multi-personality bus switch 162 buffer data to and from the transmit and receive pairs of differential data lines in the extended metal contacts for extended protocols such as PCI-Express, Firewire IEEE 1394, Serial-Attached SCSI, and SATA. When an initialization routine executed by processor system 150 determines that inserted peripheral 168 supports SATA, personality selector 164 configures multi-personality bus switch 162 to connect extended USB socket 166 to SATA processor 158. When the initialization routine executed by processor system 150 determines that inserted peripheral 168 supports PCI-Express, personality selector 164 configures multi-personality bus switch 162 to connect extended USB socket 166 to PCI-Express processor 156. Then processor system 150 communicates with either PCI-Express processor 156 or SATA processor 158 instead of USB processor 154 when extended mode is activated.

Figure 10B:
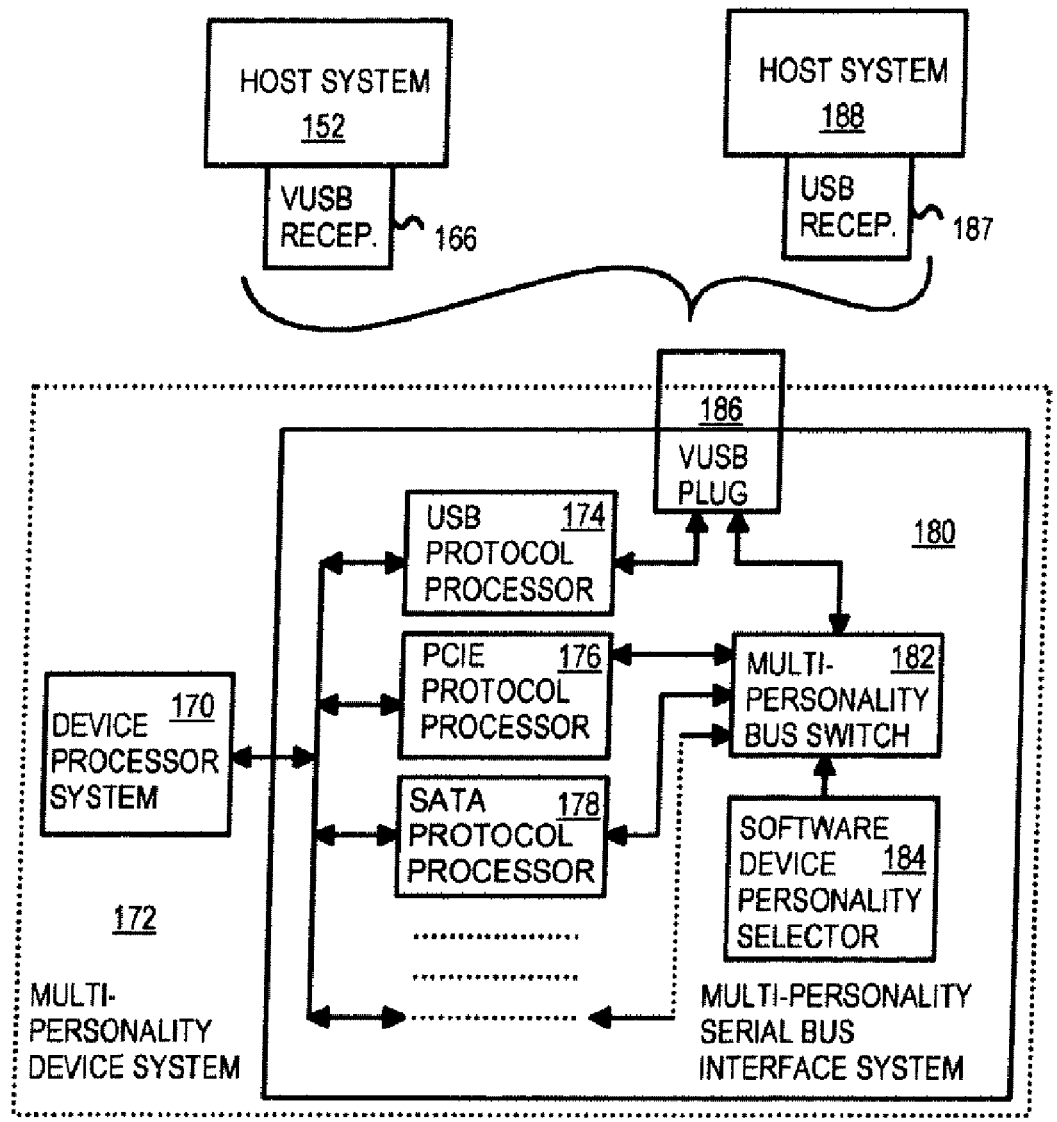
FIG. 10B is a block diagram of a peripheral with an extended-USB connector that supports extended-mode communication according to one embodiment of the invention.

FIG. 10B is a block diagram of an exemplary peripheral with one embodiment of an extended-USB connector that supports extended-mode communication. The configuration as shown in FIG. 10B may be utilized with embodiments of techniques described above. Multi-personality peripheral 172 has extended USB connector 186 that could be plugged into extended-USB socket 166 of host 152 that has extended-mode communication capabilities such as SATA, 1394, SA-SCSI, or PCI-Express. Alternately, extended USB connector 186 of multi-personality peripheral 172 could be plugged into standard-USB socket 187 of host 188 that only supports standard USB communication.

Multi-personality peripheral 172 has processor system 170 for executing control programs including USB-peripheral-control and response programs. Multi-personality serial-bus interface 180 processes data from processor system 170 using various protocols. USB processor 174 processes data using the USB protocol, and inputs and outputs USB data on the USB differential data lines in extended USB connector 186.

The extended metal contact pins in extended USB connector 186 connect to multi-personality bus switch 182. Transceivers in multi-personality bus switch 182 buffer data to and from the transmit and receive pairs of differential data lines in the extended metal contacts for extended protocols such as PCI-Express, 1394, SA SCSI, and SATA. When a control or configuration routine executed by processor system 170 determines that host 152 has configured multi-personality peripheral 172 for SATA, personality selector 184 configures multi-personality bus switch 182 to connect extended USB connector 186 to SATA processor 178. When the initialization routine executed by processor system 170 determines that inserted peripheral 188 supports PCI-Express, personality selector 184 configures multi-personality bus switch 182 to connect extended USB connector 186 to PCI-Express processor 176. Then processor system 170 communicates with either PCI-Express processor 176 or SATA processor 178 instead of USB processor 174 when extended mode is activated.

If a PCI Express device with an extended USB plug is plugged into a host system with a conventional USB receptacle, nothing will be recognized if the PCI Express device does not support USB. The host system will not see anything that has plugged into the system. The same is true for a SATA-only device, etc.

Figure 11:
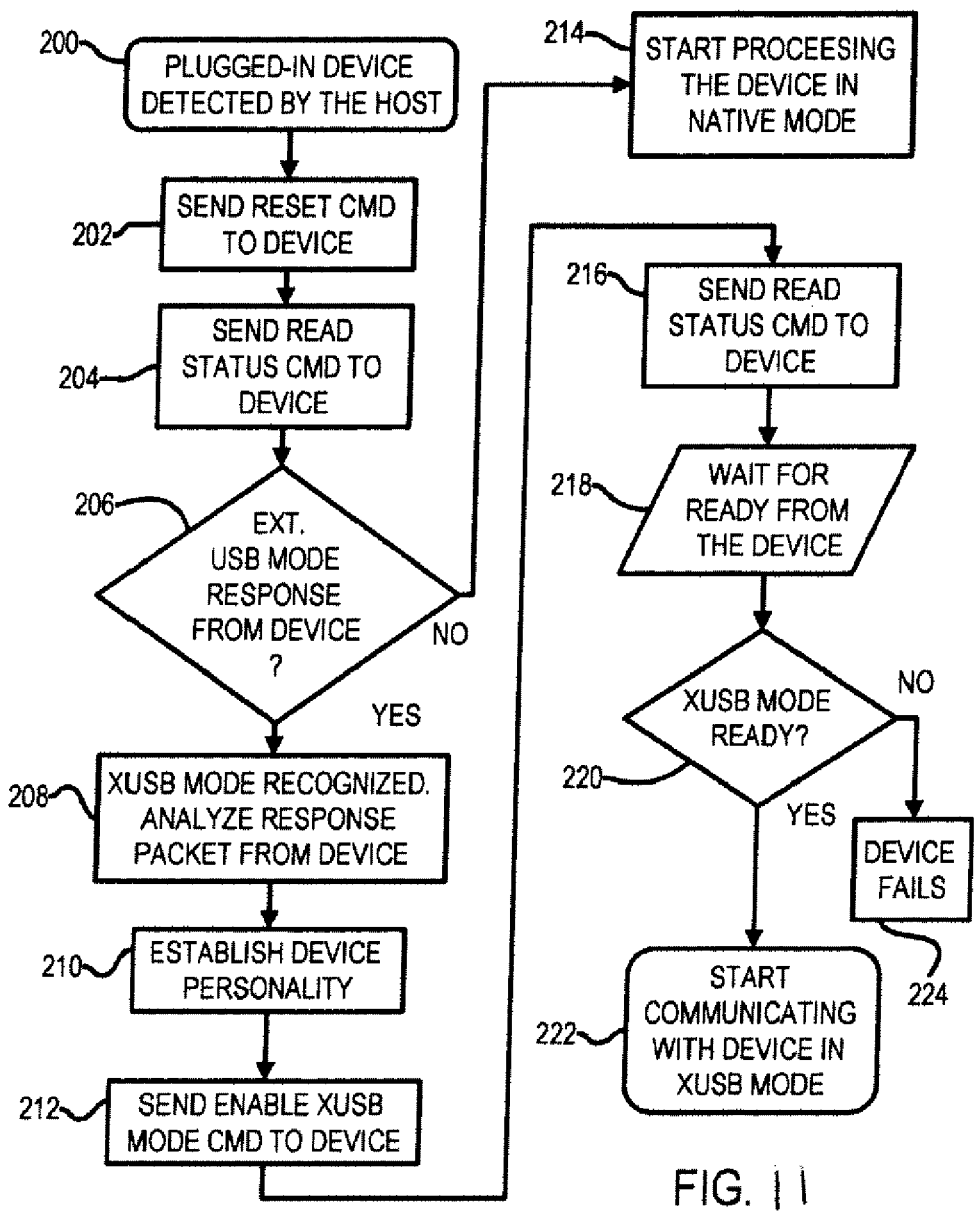
FIG. 11 is a flowchart of an initialization routine executed by a host for detecting a device plugged into an extended USB socket according to one embodiment of the invention.

FIG. 11 is a flowchart of one embodiment of an initialization routine executed by a host for detecting a device plugged into an extended USB socket. A host such as a PC can have an extended USB socket. Either an extended USB device, or a standard USB device can be plugged into the extended USB socket. This routine detects whether the inserted device supports extended-USB mode or only standard USB mode. The routine may be executed by processor system 150 of FIG. 10A.

The host detects a newly-inserted device plugged into the extended USB socket, step 200, such as by detecting resistance changes on the metal contact pins of the extended USB socket. When the newly-inserted device is detected, a USB reset command is sent over the USB differential signal lines to the device, step 202. A USB read-status command is then sent by the host, step 204.

The peripheral device responds by sending its status information using USB protocols. The host examines this status information, and in particular looks for a mode identifier indicating that the peripheral supports extended-USB mode. This mode identifier can be a status bit or a unique code in an area reserved for use by the peripheral vendor to identify the peripheral's type or capabilities.

When the peripheral responds with a status indicating no extended-USB support, step 206, then processing continues in native USB mode, step 214. Standard USB transactions are performed between the host and the peripheral using the differential USB data pins in the four-pin side of the extended USB socket. The peripheral likely has a standard USB connector that has only 4 metal contact pins, not the extension with the 8 additional metal contact pins.

When the peripheral responds with a status indicating extended-USB support, step 206, then the host further examines the packet from the peripheral to determine that the peripheral can support higher-speed communication using the extended metal contact pins, step 208. The peripheral has an extended USB connector with the 8 additional metal contact pins in an extension portion of the connector.

The host can further examine the capabilities of the peripheral, such as to determine which extended modes are supported, step 210. Some peripherals may support PCI-Express communication in extended mode, while others support Serial-ATA, Serial Attached SCSI, or IEEE 1394 as the extended-mode protocol.

The host then sends a vendor-defined USB OUT command to the peripheral, step 212. This command instructs the peripheral to activate its extended mode of operation. The host verifies that the device received the command by reading its status again, step 216. The peripheral responds with a ready status, step 218. If the status read back from the device does not indicate that the peripheral is ready to switch to extended mode, step 220, then the device fails, step 224. The host could fall back on standard USB mode, step 214, or attempt again to activate extended mode, step 202. After trying a predetermined number of times, the host falls back on standard USB mode, step 214.

When the peripheral responds with the correct ready, step 220, then the host and peripheral can begin communicating in the extended mode. The 8 additional metal contact pins in the extended portion of the USB connector and socket are used for communication rather than the 4 USB metal contact pins. For example, the PCI-Express transmit and receive differential pairs can be used to bidirectionally send and receive data when the device has a PCI-Express personality. The host uses these extended pins to send a read-status command to the peripheral, step 222. Data can be sent and received at the higher rates supported by PCI-Express rather than the slower USB rates.

Figure 12:
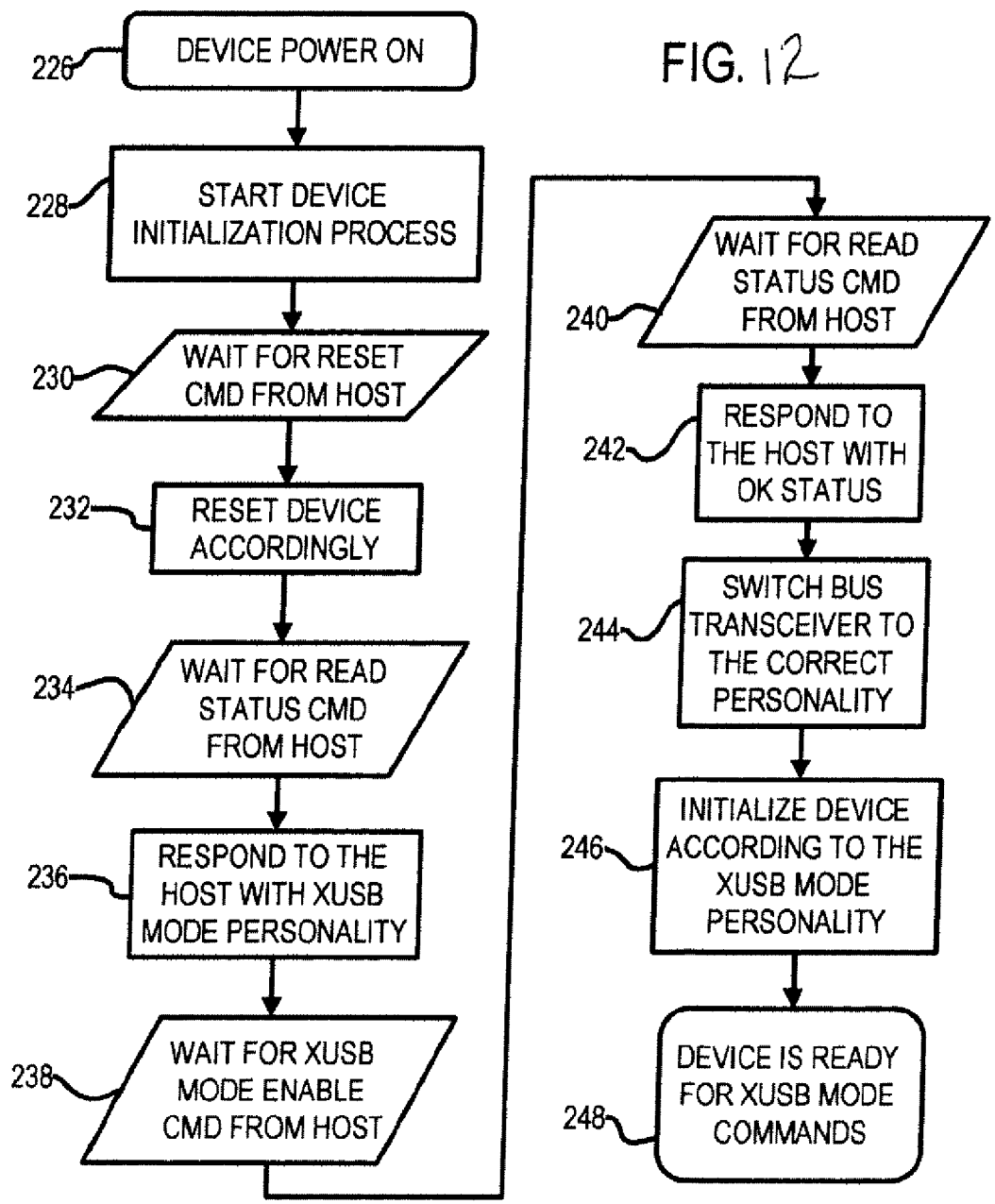
FIG. 12 is a flowchart of an initialization routine executed by a peripheral device plugged into an extended USB socket according to one embodiment of the invention.

FIG. 12 is a flowchart of one embodiment of an initialization routine executed by a peripheral device plugged into an extended USB socket. A peripheral can have an extended USB connector that can be plugged into either an extended USB socket or a standard USB socket. This routine executes on the peripheral device and helps the host detect that the inserted device supports extended-USB mode. The routine may be executed by peripheral-device processor system 170 of FIG. 10B.

When the peripheral device is plugged into the USB socket, power is received though the power and ground pins on the 4-pin USB portion of the connector, step 226. The peripheral device executes any initialization procedures to power itself up, step 228, and waits for a reset command from the host, step 230. Once the reset command is received from the host, the peripheral device resets itself, step 232.

The peripheral device waits for further commands from the host, step 234, such as a read-status command. The status read by the host, or further data read by the host can contain capability information about the peripheral device, such as which extended modes are supported, PCI-Express, SATA, IEEE 1394, SA SCSI, etc., step 236. The reset and read-status commands are standard USB commands from the host.

The peripheral device then waits for a command from the host to enable extended-mode communication, step 238. An enable command followed by another read-status command must be received, so the peripheral waits for the read-status command, step 240. Once the read-status command is received, the peripheral responds with an OK or READY status to indicate that it is ready to switch to using the extended metal contact pins on the connector, step 242.

Then the peripheral device switches its bus transceivers to match the bus-protocol specified by the host to be able to communicate over the 8 extension metal contact pins, step 244. The 4 USB metal contact pins are not used. The peripheral device waits for a read-status command sent by the host over the extended metal contact pins and responds to this read-status command, step 246, initializing for the new protocol mode. The peripheral device can then receive extended commands such as PCI-Express commands that are received over the extended metal contact pins on the extended portion of the connector, such as the PCI-Express transmit and receive differential lines, step 248.

FIG. 13 is a table of extended and standard pins in one embodiment of an extended USB connector and socket. The A side of the pin substrates contains the four standard USB signals, which include a 5-volt power signal and ground. The differential USB data D−, D+ are carried on pins 2 and 3. These pins are not used for extended modes.

Side B of the pin substrates, or the extension of the primary surfaces, carries the extended signals. Pin 1 is a 3.3-volt power signal for modified PCI-Express generation 0 and Serial-ATA (SATA), while pin 2 is a 1.5-volt supply for modified PCI-Express generation 0 and reserved for SATA. For modified PCI-Express generations 1, 2, and 3, pins 1 and 2 carry the transmit differential pair, called PETn, PETp, respectively. Pin 8 is a 12-volt power supply for SATA and reserved for modified PCI-Express generation 0. Pin 8 is a ground for modified PCI-Express generations 2 and 3. Pin 5 is a ground for modified PCI-Express generation 0 and SATA.

Pins 3 and 4 carry the transmit differential pair, PETn, PETp, respectively, for modified PCI-Express generation 0, and T−, T+, respectively, for SATA. Pin 3 is a ground for modified PCI-Express generations 1, 2, and 3. Pin 4 and pin 5 carry receive differential pair, called PERn and PERp, respectively, for modified PCI-Express generations 1, 2, and 3. Pins 6 and 7 carry the receive differential pair, PERn, PERp, respectively, for modified PCI-Express generation 0 and R−, R+, respectively, for SATA. Pins 6 and 7 carry a second transmit differential pair, called PETn1 and PETp1, respectively, for modified PCI-Express generations 2 and 3.

Pins 9 and 10 carry a second receive differential pair, called PERn1 and PERp1, respectively, for modified PCI-Express generations 2 and 3.

Pins 11 and 12 carry a third transmit differential pair, called PETn2 and PETp2, respectively, for modified PCI-Express generation 3. Pin 13 is a ground for modified PCI-Express generation 3. Pins 14 and 15 carry a third receive differential pair, called PERn2 and PERp2, respectively, for modified PCI-Express generation 3.

Pins 16 and 17 carry a fourth transmit differential pair, called PETn3 and PETp3, respectively, for modified PCI-Express generation 3. Pin 18 is a ground for modified PCI-Express generation 3. Pins 19 and 20 carry a fourth receive differential pair, called PERn3 and PERp3, respectively, for modified PCI-Express generation 3.

The ExpressCard pins REFCLK+, REFCLK−, CPPE#, CLKREQ#, PERST#, and WAKE# are not used in the extended USB connector to reduce the pin count. Additional pins may be added to the extended USB connector and socket if some or all of these pins are desired. Furthermore, the pin names and signal arrangement (or order) illustrated in FIG. 10 is merely one embodiment. It should be apparent that other pin names and signal arrangement (or order) may be adopted in other embodiments.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the present invention also relate to an apparatus for performing the operations herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), erasable programmable ROMs (EPROMs), electrically erasable programmable ROMs (EEPROMs), magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

A machine-readable medium may include any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An extended universal serial bus (USB) storage device, comprising:
    a printed circuit board assembly (PCBA) having a flash memory device and a flash controller mounted thereon;
    an extended USB connector plug coupled to the PCBA for providing a USB compatible interface between an external device and the flash memory device and the flash controller, wherein the extended USB connector plug includes a first end used to couple to the external device and a second end coupled to the flash memory device and the flash controller,
    wherein the first end of the extended USB connector plug includes
        an extended pin substrate that has an extended length that is longer than or equal to a standard length of the pin substrate of the standard USB connector plug,
        a plurality of plug standard metal contact pins disposed on a top surface of the pin substrate, wherein when the standard pin substrate of the extended USB connector plug is inserted into a cavity of the standard USB socket, the standard metal contact pins make physical and electrical contact with plug standard metal contact pins on a plug pin substrate, and
        a plurality of plug extended metal contact pins on a bottom surface of the extended pin substrate, wherein when the extended pin substrate of the extended USB connector plug is inserted into a cavity of the extended USB socket, the plug extended metal contact pins on the extended pin substrate make physical and electrical contact with socket extended metal contact pins on the extended USB socket,
    wherein the plug extended metal contact pins comprise a first transmit differential pair, a first receive differential pair, and a ground pin, wherein the first transmit differential pair includes a first positive transmit pin (PETp) and a first negative transmit pin (PETn) for transmitting signals, wherein the receive differential pair includes a first positive receive pin (PERp) and a first negative receive pin (PETn) for receiving signals,
    wherein the plug extended metal contact pins further comprise a second transmit differential pair and a second receive differential pair, wherein the second transmit differential pair includes a second positive transmit pin (PETp1) and a second negative transmit pin (PETn1) for transmitting signals, wherein the second receive differential pair includes a second positive receive pin (PERp1) and a second negative receive pin (PETn1) for receiving signals,
    wherein the second end of the extended USB connector plug includes a plurality of electrical contact pins to electrically couple the flash memory device and the flash controller, including
        a first row of electrical contact pins, the first row having five electrical contact pins soldered on five solder pads of on a first surface of the PCBA, and
        a second row of electrical contact pins, the second row having four electrical contact pins soldered on four solder pads of a second surface of the PCBA;
    a housing for enclosing the PCBA and the extended USB connector plug, the housing having an opening and a slot; and
    a positioning member extended from the PCBA via the slot, which when pressed and pushed along the slot, moves the PCBA and the extended USB connector plug in and out of the housing via the opening, wherein the positioning member comprises
        a base portion fixedly connected to the PCBA,
        a flexible wall integrally connected to the base portion and disposed adjacent to a first housing well that defines the slot,
        a first locking structure that is fixedly disposed on the flexible wall,
        a first and second slide rails fixedly connected to the base portion and disposed adjacent to a second housing wall opposite to the first housing wall, and
        a push-push button that is fixedly disposed on the flexible wall,
    wherein the positioning member is movably disposed inside the housing such that a portion of the press-push button extends through the slot and is exposed outside the housing, wherein when the press-push button is pressed into the housing, the first and second slide rails contact the second housing wall and the flexible wall is bent from an original shape such that the first locking structure is biased away from the first housing wall, and wherein when the press-push button is subsequently released, the flexible wall resiliently returns to the original shape and the first locking structure is pressed against the first housing wall.

2. The device of claim 1, wherein the plurality of electrical contact pins of the second end is disposed on a first surface of the PCBA, wherein the flash controller is disposed on the first surface of the PCBA, and wherein the flash memory device is disposed on a second surface of the PCBA.

3. The device of claim 2, wherein the flash memory device and the flash controller are integrated into a chip-on-board (COB) package, and wherein the COB package is disposed on the first surface of the PCBA.

4. The device of claim 3, wherein the plurality of electrical contact pins comprises nine contact pins soldered on nine corresponding solder pads disposed on the first surface of the PCBA, and wherein the first surface is a top surface and the second surface is a bottom surface.

5. The device of claim 4, further comprising a housing for enclosing the PCBA and at least a portion of the extended USB connector plug, the housing having a top portion and a bottom portion attached to each other via a snap-together method or via an ultrasonic sealing method.

6. The device of claim 1, wherein the flash memory device and the flash controller are integrated into a chip-on-board (COB) package, and wherein the COB package is disposed on the first surface of the PCBA.

7. The device of claim 1, wherein the flexible wall includes a fixed end that is integrally connected to the base portion and a free end that is disposed away from the base station, and wherein the press-push button is disposed on the flexible wall adjacent to the fixed end.

8. The device of claim 1, wherein the flexible wall includes opposing first and second ends that are integrally connected to the base portion such that standoff gap is defined between a central portion of the flexible wall and the base portion, wherein the press-push button is disposed on the flexible wall adjacent to the central portion.

9. The device of claim 1, wherein the first transmit differential pair and the first receive differential pair are used to transmit and receive signals that are compatible with PCI Express (PCIE) generation zero specification and PCIE generation 1 specification.

10. The device of claim 9, wherein the PETn pin and PETp pin of the first transmit differential pair are positioned adjacent to each other, and wherein the PERn pin and PERp pin of the first receive differential pair are positioned adjacent to each other.

11. The device of claim 9, wherein the second transmit differential pair and the second receive differential pair are used to transmit and receive signals that are compatible with PCIE generation two specification.

12. The device of claim 9, wherein the PETn1 and PETp1 pins are positioned adjacent to each other, and wherein the PERn1 and PERp1 pins are positioned adjacent to each other.

13. The device of claim 11, wherein the plug extended metal contact pins further comprise a third transmit differential pair, a third receive differential pair, a fourth transmit differential pair, and a fourth receive differential pair, wherein the third transmit differential pair includes a third positive transmit pin (PETp2) and a third negative transmit pin (PETn2) for transmitting signals, wherein the third receive differential pair includes a third positive receive pin (PERp2) and a third negative receive pin (PETn2) for receiving signals, wherein the fourth transmit differential pair includes a fourth positive transmit pin (PETp3) and a fourth negative transmit pin (PETn3) for transmitting signals, wherein the fourth receive differential pair includes a fourth positive receive pin (PERp3) and a fourth negative receive pin (PETn3) for receiving signals.

14. The device of claim 13, wherein the second transmit differential pair, the second receive differential pair, the third transmit differential pair, the third receive differential pair, the fourth transmit differential pair, and the fourth receive differential pair are used to transmit and receive signals that are compatible with PCIE generation three specification.

15. The device of claim 13, wherein the PETn2 and PETp2 pins are positioned adjacent to each other, and wherein the PERn2 and PERp2 pins are positioned adjacent to each other.

16. The device of claim 15, wherein the PETn3 and PETp3 pins are positioned adjacent to each other, and wherein the PERn3 and PERp3 pins are positioned adjacent to each other.

* * * * *